(12) United States Patent
Song et al.

(10) Patent No.: US 10,285,285 B2
(45) Date of Patent: May 7, 2019

(54) SIDE KEY AND ELECTRONIC DEVICE INCLUDING THE SAME

(71) Applicant: Samsung Electronics Co., Ltd., Gyeonggi-do (KR)

(72) Inventors: Dong Hun Song, Gyeonggi-do (KR); Dong Hoon Lee, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 43 days.

(21) Appl. No.: 15/440,827

(22) Filed: Feb. 23, 2017

(65) Prior Publication Data

US 2017/0245376 A1 Aug. 24, 2017

(30) Foreign Application Priority Data

Feb. 24, 2016 (KR) .................. 10-2016-0021957

(51) Int. Cl.
| | | |
|---|---|---|
| *H01H 15/00* | (2006.01) | |
| *H05K 5/00* | (2006.01) | |
| *H01H 13/14* | (2006.01) | |
| *H01H 13/70* | (2006.01) | |
| *H05K 7/14* | (2006.01) | |
| *H04M 1/23* | (2006.01) | |
| *H04M 1/02* | (2006.01) | |

(52) U.S. Cl.
CPC .............. *H05K 5/006* (2013.01); *H01H 13/14* (2013.01); *H01H 13/70* (2013.01); *H04M 1/236* (2013.01); *H05K 5/0008* (2013.01); *H05K 7/1427* (2013.01); *H04M 1/0277* (2013.01)

(58) Field of Classification Search
CPC ...... H01H 15/02; H01H 15/005; H01H 15/06; H01H 13/14; H01H 13/70; H04M 1/236; H04M 1/0277; H05K 5/006; H05K 5/0008; H05K 7/1427
USPC ........................................ 361/288, 291, 287
See application file for complete search history.

(56) References Cited

U.S. PATENT DOCUMENTS

| | | | | |
|---|---|---|---|---|
| 2011/0192709 A1* | 8/2011 | Xiao | .................. | H01H 1/26 200/341 |
| 2011/0228494 A1* | 9/2011 | Xiao | ................... | H01H 13/705 361/752 |

(Continued)

FOREIGN PATENT DOCUMENTS

| | | |
|---|---|---|
| KR | 1020040009948 | 1/2004 |
| KR | 100711727 | 4/2007 |
| KR | 1020160097102 | 8/2016 |

*Primary Examiner* — Steven T Sawyer
(74) *Attorney, Agent, or Firm* — The Farrell Law Firm, P.C.

(57) ABSTRACT

An electronic device includes an outer housing including a first surface, a second surface, and a side surface, a printed circuit board seated in the outer housing, and at least one side key coupled to a peripheral area of the outer housing. The side key includes at least one contact part exposed through a through-hole formed in the side surface of the outer housing, a side key circuit board including a switch module that contacts the contact part when the contact part is pressed, the side key circuit board being electrically connected to the printed circuit board, a side key bracket in which at least a portion of the side key circuit board is seated and which fixes and supports the side key circuit board, and one or more molded members that are coupled to opposite ends of the side key bracket and are coupled to the outer housing.

17 Claims, 28 Drawing Sheets

(56) References Cited

U.S. PATENT DOCUMENTS

2011/0255260 A1* 10/2011 Weber .................. H04M 1/026
                                                      361/807
2012/0050962 A1* 3/2012 Hsiung ................ H01H 13/705
                                                      361/679.01
2016/0233037 A1    8/2016 Lee et al.

* cited by examiner

SIDE KEY AND ELECTRONIC DEVICE INCLUDING THE SAME

PRIORITY

This application claims priority under 35 U.S.C. § 119(a) to a Korean Patent Application filed on Feb. 24, 2016 in the Korean Intellectual Property Office and assigned Serial No. 10-2016-0021957, the entire disclosure of which is incorporated herein by reference.

BACKGROUND

1. Field of the Disclosure

The disclosure relates to a side key and an electronic device including the same.

2. Description of the Related Art

An electronic device such as a smartphone may provide various functions, such as a voice communication function and a multimedia file reproducing function. In order to perform functions of adjusting a volume of a communication sound, adjusting a volume of a multimedia file reproducing sound, or turning on and off a screen, a side key may be provided on one surface of the electronic device.

If a contact part of the side key provided on one surface of the electronic device is pressed, it may move into the electronic device, and a switch module contacting the contact part of the side key may be operated due to the movement of the side key generating an electrical signal. The generated electrical signal may be delivered to a processor mounted on a printed circuit board to perform a function related to a key input.

Opposite ends of a key bracket of the side key, which is formed of stainless steel, may be bent, and the bent opposite ends of the key bracket may be seated on and fixed to coupling recesses provided in an outer (or external) housing. However, if the width of the bent parts and the width of the coupling recesses do not correspond to each other, a deviation in the assembly is caused and the side key bracket is moved towards the front and rear surface of the outer housing due to the assembly deviation so that a click feeling of the side key may deteriorate.

SUMMARY

The present disclosure has been made to address at least the above-mentioned problems and/or disadvantages and to provide at least the advantages described below. Accordingly, an aspect of the present disclosure is to provide a side key in which molded members are coupling to opposite ends of a side key bracket and are coupled to coupled recesses, and an electronic device including the same.

In accordance with an aspect of the present disclosure, an electronic device includes an outer housing having a first surface facing in a first direction, a second surface facing in a second direction that is opposite to the first direction, and a side surface surrounding at least a portion of a space between the first surface and the second surface, a printed circuit board seated in the outer housing, and at least one side key coupled to the side surface of the outer housing. The side key includes at least one contact part exposed through a through-hole formed on the side surface of the outer housing, a side key circuit board comprising a switch module that contacts the contact part when the contact part is pressed, the side key circuit board being electrically connected to the printed circuit board, a side key bracket in which at least a portion of the side key circuit board is seated and which fixes and supports the side key circuit board, and one or more molded members that are coupled to opposite ends of the side key bracket and are coupled to the outer housing.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
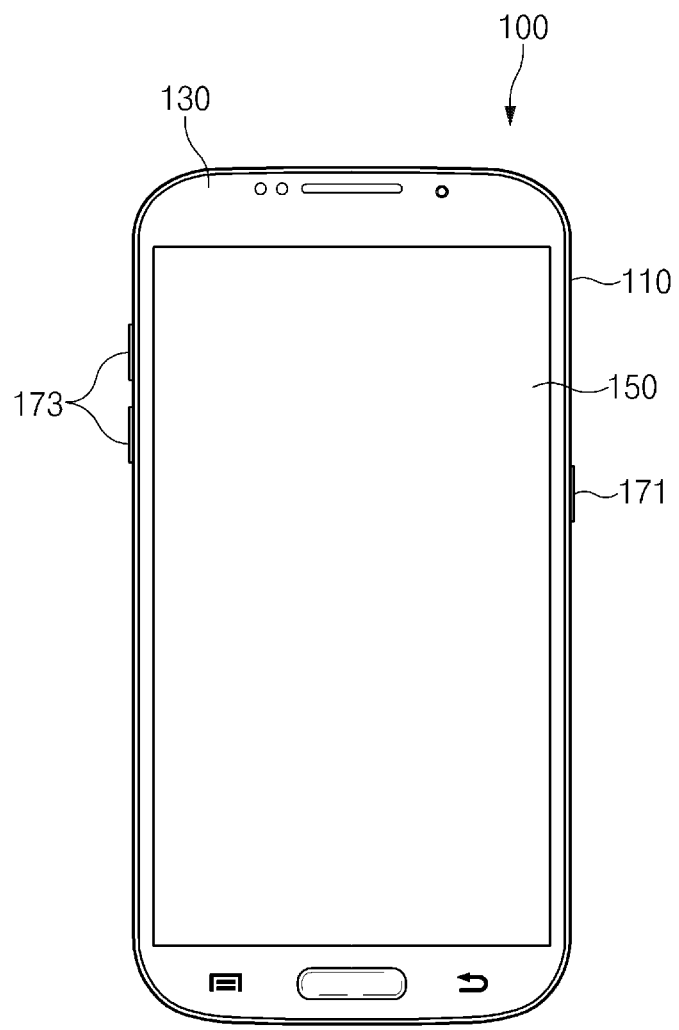
FIG. 1 illustrates an electronic device according to an embodiment of the present disclosure.

Hereinafter, various embodiments of the present disclosure are disclosed with reference to the accompanying drawings. However, the present disclosure is not intended to limit the various embodiments of the present disclosure to a specific embodiment and it is intended that the present disclosure covers all modifications, equivalents, and/or alternatives of the present disclosure as defined by the appended claims and their equivalents. With respect to the descriptions of the accompanying drawings, like reference numerals refer to like elements.

The terms and words used in the following description and claims are not limited to their dictionary meanings, but are merely used to enable a clear and consistent understanding of the present disclosure. Accordingly, it should be apparent to those skilled in the art that the following description of various embodiments of the present disclosure is provided for illustration purpose only and not for the purposes of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The terms "include," "comprise," and "have", or "may include," or "may comprise" and "may have" used herein indicate disclosed functions, operations, or existence of elements but do not exclude other functions, operations or elements.

For example, the expressions "A or B," or "at least one of A and/or B" may indicate A and B, A, or B. For instance, the expression "A or B" or "at least one of A and/or B" may indicate (1) at least one A, (2) at least one B, or (3) both at least one A and at least one B.

The terms such as "1st," "2nd," "first," "second," and the like used herein may refer to modifying different elements of various embodiments of the present disclosure, but are not intended to limit the elements. For instance, "a first user device" and "a second user device" may indicate different users regardless of order or importance. For example, a first component may be referred to as a second component and vice versa without departing from the scope and spirit of the present disclosure.

In various embodiments of the present disclosure, it is intended that when a component (for example, a first component) is referred to as being "operatively or communicatively coupled with/to" or "connected to" another component (for example, a second component), the component may be directly connected to the other component or connected through another component (for example, a third component). In various embodiments of the present disclosure, it is intended that when a component (for example, a first component) is referred to as being "directly connected to" or "directly accessed" another component (for example, a second component), another component (for example, a third component) does not exist between the component (for example, the first component) and the other component (for example, the second component).

The expression "configured to" used in various embodiments of the present disclosure may be interchangeably used with "suitable for," "having the capacity to," "designed to," "adapted to," "made to," or "capable of" according to the situation, for example. The term "configured to" may not necessarily indicate "specifically designed to" in terms of hardware. Instead, the expression "a device configured to" in some situations may indicate that the device and another device or part are "capable of." For example, the expression "a processor configured to perform A, B, and C" may indicate a dedicated processor (for example, an embedded processor) for performing a corresponding operation or a general purpose processor (for example, a central processing unit (CPU) or application processor (AP)) for performing corresponding operations by executing at least one software program stored in a memory device.

Terms used in various embodiments of the present disclosure are used to describe certain embodiments of the present disclosure, but are not intended to limit the scope of other embodiments. The terms of a singular form may include plural forms unless they have a clearly different meaning in the context. Otherwise, all terms used herein may have the same meanings that are generally understood by a person skilled in the art. In general, terms defined in a dictionary should be considered to have the same meanings as the contextual meaning of the related art, and, unless clearly defined herein, should not be understood differently or as having an excessively formal meaning. In any case, even the terms defined in the present specification are not intended to be interpreted as excluding embodiments of the present disclosure.

An electronic device according to various embodiments of the present disclosure may include at least one of a smartphone, a tablet personal computer (PC), a mobile phone, a video telephone, an electronic book reader, a desktop PC, a laptop PC, a netbook computer, a workstation, a server, a personal digital assistant (PDA), a portable multimedia player (PMP), a Motion Picture Experts Group (MPEG-1 or MPEG-2) Audio Layer 3 (MP3) player, a mobile medical device, a camera, or a wearable device. The wearable device may include at least one of an accessory-type device (e.g., a watch, a ring, a bracelet, an anklet, a necklace, glasses, a contact lens, a head-mounted device (HMD)), a textile- or clothing-integrated-type device (e.g., an electronic apparel), a body-attached-type device (e.g., a skin pad or a tattoo), or a bio-implantable-type device (e.g., an implantable circuit)

In some various embodiments of the present disclosure, an electronic device may be a home appliance. The smart home appliance may include at least one of, for example, a television (TV), a digital video/versatile disc (DVD) player, an audio, a refrigerator, an air conditioner, a cleaner, an oven, a microwave oven, a washing machine, an air cleaner, a set-top box, a home automation control panel, a security control panel, a television (TV) box (e.g., Samsung HomeSync™, Apple TV™, or Google TV™), a game console (e.g., Xbox™ or PlayStation™), an electronic dictionary, an electronic key, a camcorder, or an electronic picture frame In other various embodiments of the present disclosure, an electronic device may include at least one of various medical devices (e.g., various portable medical measurement devices (e.g., a blood glucose measuring device, a heart rate measuring device, a blood pressure measuring device, a body temperature measuring device, or the like), a magnetic resonance angiography (MRA), a magnetic resonance imaging (MRI), a computed tomography (CT), a scanner, an ultrasonic device, or the like), a navigation device, a global navigation satellite system (GNSS), an event data recorder (EDR), a flight data recorder (FDR), a vehicle infotainment device, electronic equipment for vessels (e.g., a navigation system, a gyrocompass, or the like), avionics, a security device, a head unit for a vehicle, an industrial or home robot, an automatic teller machine (ATM), a point of sales (POS) device of a store, or an Internet of things (IoT) device (e.g., a light bulb, various sensors, an electric or gas meter, a sprinkler, a fire alarm, a thermostat, a streetlamp, a toaster, exercise equipment, a hot water tank, a heater, a boiler, or the like).

According to various embodiments of the present disclosure, an electronic device may include at least one of a part of furniture or a building/structure, an electronic board, an electronic signature receiving device, a projector, or a measuring instrument (e.g., a water meter, an electricity meter, a gas meter, a wave meter, or the like). An electronic device may be one or more combinations of the above-mentioned devices. An electronic device according to some various embodiments of the present disclosure may be a flexible device. An electronic device according to an embodiment of the present disclosure is not limited to the above-mentioned devices, and may include new electronic devices with the development of new technology.

Hereinafter, an electronic device according to various embodiments of the present disclosure will be described in more detail with reference to the accompanying drawings. The term "user" used herein may refer to a person who uses an electronic device or may refer to a device (e.g., an artificial intelligence electronic device) that uses an electronic device.

Figure 2:
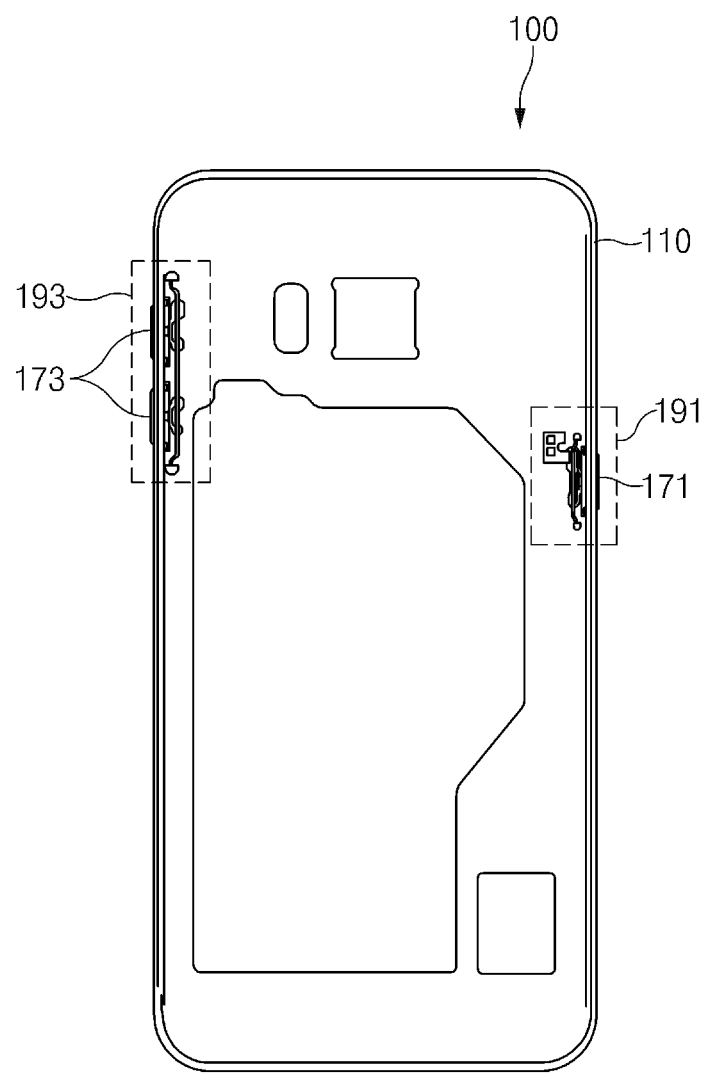
FIG. 2 illustrates an outer housing and side keys of an electronic device according to an embodiment of the present disclosure.

FIG. 1 illustrates an electronic device according to an embodiment. FIG. 2 illustrates an outer housing and side keys of an electronic device according to an embodiment.

Referring to FIGS. 1 and 2, the electronic device 100 may include an outer (or external) housing 110, a front case 130, a display 150, a first side key 171, and a second side key 173. The outer housing 110 may fix and support internal components (e.g., the display 150 and a printed circuit board (not illustrated)) included in the electronic device 100. For example, the printed circuit board, on which a processor, a memory, a communication module, or the like is mounted, may be seated in and fixed to the outer housing 110. The outer housing 110 may include a front surface, a rear surface, and side surfaces that surround at least a portion of a space between the front surface and the rear surface. One or more through-holes may be provided in some areas of the side surfaces of the outer housing 110, and the first side key 171 and the second side key 173 may be exposed to the outside through the through-holes.

The front case 130 may define a front external appearance of the electronic device 100, and may be coupled to the outer housing 110 while a space for accommodating the internal components is provided inside the outer housing 110. At least an area of the front case 130 may be formed of a transparent material (e.g., glass), and a screen that is output through the display 150 may be displayed to the outside through the transparent area of the front case 130.

The display 150 may display various contents (e.g., a text, an image, a video, an icon, and a symbol). The display 150 may include a touch screen and receive, for example, a touch, a gesture, a proximity, or a hovering input using an electronic pen or a part of the user's body.

The first side key 171 and the second side key 173 may provide interfaces for user inputs. For example, if the user presses a contact part of the first side key 171 or the second side key 173, the pressed contact part of the side key moves into the outer housing 110, and a switch module that contacts the contact part of the side key is operated due to the movement of the side key to generate an electrical signal. The electronic device 100 may perform a function related to an input of the side key in response to the generated electrical signal. According to an embodiment, the electronic device 100 may perform, for example, a function of turning on and off a screen of the display 150 in response to an input of the first side key 171, and may perform, for example, a function of adjusting a communication volume or a multimedia file reproducing volume in response to an input of the second side key 173.

The first side key 171 and the second side key 173 may be coupled to be exposed to the outside through through-holes provided on the side surfaces of the outer housing 110. The drawing illustrates a state in which the first side key 171 is coupled to a right peripheral area 191 of the outer housing 110 and the second side key 173 is coupled to a left peripheral area 193 of the outer housing 110. According to an embodiment, the first side key 171 has one contact part, and the second side key 173 has two contact parts. However, the present disclosure is not limited thereto. According to various embodiments, at least one of the side keys of the electronic device 100 may be excluded or at least one other side key may be further included. Further, the side key or the at least one other side key may have one, two, or three contact parts.

Figure 3A:
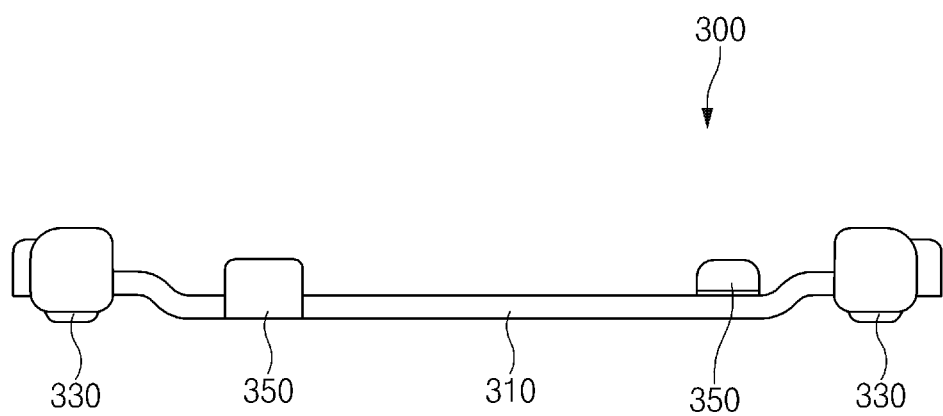
FIGS. 3A and 3B illustrate a side key bracket and molded members according to an embodiment of the present disclosure.
Figure 3B:
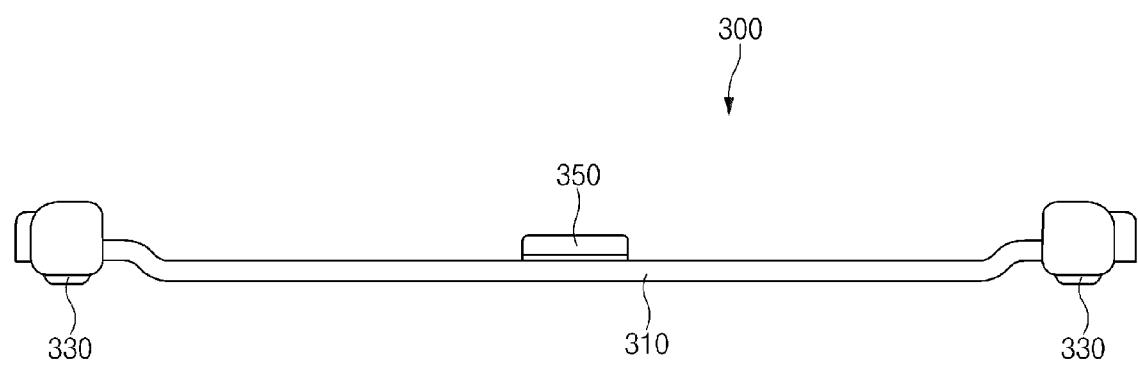

FIGS. 3A and 3B illustrate a side key bracket and molded members according to an embodiment.

Referring to FIGS. 3A and 3B, the side key 300 may include a side key bracket 310 and molded members 330. Although not illustrated, the side key 300 may further include a contact part that is exposed through a through-hole of an outer housing (e.g., the outer housing 110), and a side key circuit board that includes a switch module that contacts the contact part based on whether the contact part is pressed.

The side key bracket 310 may provide a space in which the side key circuit board may be seated, and may stably fix and support the side key circuit board. According to an embodiment, the side key bracket 310 may correspond to the length and width of the side key circuit board, and may extend such that opposite peripheral areas of the side key bracket 310 may be stepped in a height direction thereof (e.g., a widthwise direction of the outer housing). The space defined by the steps formed in the side key bracket 310 may be utilized as a space in which the side key circuit board may be seated. According to an embodiment, at least a portion of the side key bracket 310 may be formed of a material (e.g., stainless steel) having a specific strength or higher.

As another example, the side key bracket 310 may include at least one protrusion 350 that extends from one side surface of the side key bracket 310, is bent in a height direction, and extends by a specific length. The protrusion 350 may prevent the side key circuit board from moving in a widthwise direction of the side key bracket 310, and may prevent the side key circuit board from being separated from the side key bracket 310. For example, the protrusion 350 that extends from an upper widthwise surface of the side key bracket 310, is bent in a height direction, and extends by a specific length may prevent the side key circuit board from moving to an upper widthwise side of the side key bracket 310 and prevent the side key circuit board from being separated, and the protrusion 350 that extends from a lower widthwise surface of the side key bracket 310, is bent in a height direction, and extends by a specific length may prevent the side key circuit board from moving to a lower widthwise side of the side key bracket and prevent the side key circuit board from being separated. According to various embodiments, as illustrated in FIG. 3A, the protrusions 350 may extend from the upper and lower widthwise surfaces of the side key bracket 310, and as illustrated in FIG. 3B, one of the protrusions 350 may extend from the upper widthwise surface of the side key bracket 310. Further, the protrusion 350 may be provided in a central lengthwise area or areas that are adjacent to opposite peripheral areas of the side key bracket 310. However, the number and locations of the protrusions 350 are not limited thereto. At least one other protrusion 350 may be further provided.

The molded members 330 may be coupled to opposite ends of the side key bracket 310, and may be coupled to an outer housing. According to an embodiment, the molded members 330 may be coupled to the coupling recesses provided in the outer housing to be fixed such that the side key bracket 310 is not pushed rearwards (e.g., towards the inner side of the outer housing) when the contact part of the side key 300 is pressed. As another example, as the molded members 330 may correspond to the width of the coupling recesses to reduce an assembly deviation, the side key bracket 310 may be fixed not to be moved towards the front and rear sides of the outer housing. The molded members 330 may be coupled to the side key bracket 310 through insert molding, or the molded members 330 may be formed of plastic (e.g., polycarbonate (PC)) to be formed with a precise size.

Figure 4A:
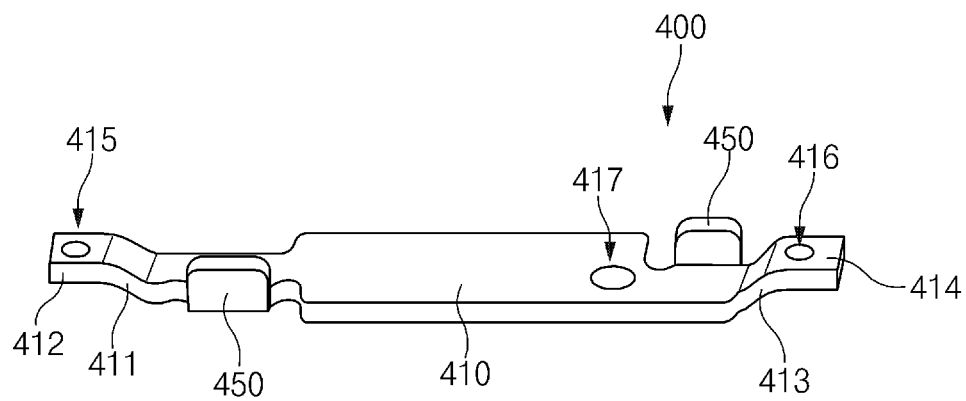
FIGS. 4A to 4C illustrates a side key bracket of a first form according to an embodiment of the present disclosure.
Figure 4B:
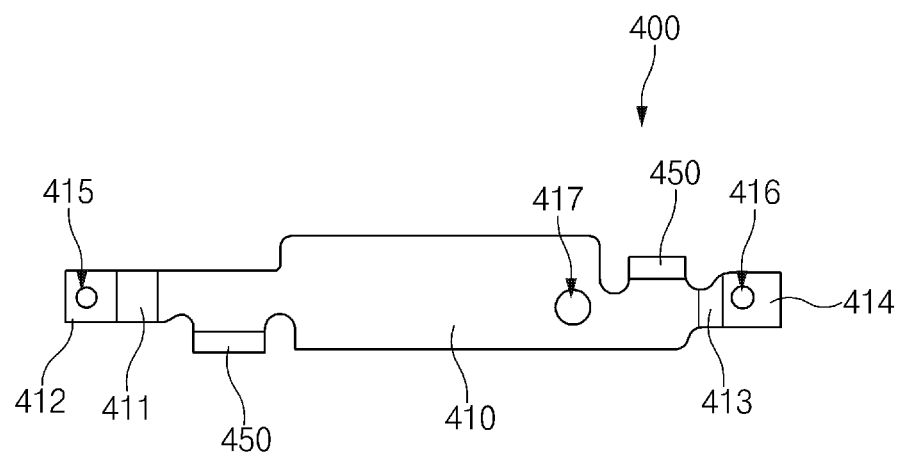
Figure 4C:
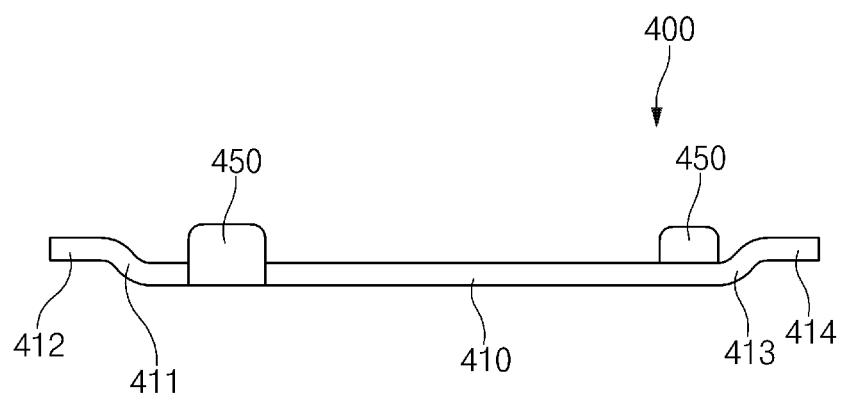

FIGS. 4A to 4C illustrates a side key bracket of a first form according to an embodiment of the present disclosure. FIG. 4A is a perspective view of a side key bracket of a first form. FIG. 4B is a plan view of a side key bracket of a first form. FIG. 4C is a side view of a side key bracket of a first form.

Referring to FIGS. 4A to 4C, the side key bracket 400 may include a central part 410, a first extending part 411, a first peripheral part 412, a second extending part 413, a second peripheral part 414, and at least one protruding part 450. According to an embodiment, the side key bracket 400 may extend such that opposite peripheral areas of the side key bracket 400 are stepped in a height direction. For example, the side key bracket 400 may include a first extending part 411 that extends from the central part 410 in a left lengthwise direction to be inclined upwards, a first peripheral part 412 that extends from the first extending part 411 to be substantially parallel to the central part 410, a second extending part 413 that extends from the central part 410 in a right lengthwise direction to be inclined upwards, and a second peripheral part 414 that extends from the second extending part 413 to be substantially parallel to the central part 410.

The first peripheral part 412 and the second peripheral part 414 may be coupled to molded members (e.g., the molded members 330), and at least one hole for increasing a coupling force with the corresponding molded member may be provided in at least one of the first peripheral part 412 or the second peripheral part 414. FIGS. 4A and 4B illustrate a state in which a first hole 415 is provided in the first peripheral part 412 and a second hole 416 is provided in the second peripheral part 414.

The central part 410 may include a guide hole 417 that guides a seating location of the side key circuit board such that the switch module provided between the contact part of the side key and the side key circuit board may be aligned when the side key circuit board is seated. FIGS. 4A and 4B illustrate a state in which one guide hole 417 is provided in a left central area of the central part 410, but the present disclosure is not limited thereto. In some embodiments, the guide hole 417 may be provided in a right central area of the central part 410, and at least one other guide hole 417 may be further provided in the central part 410.

The protrusion 450 may extend from one side surface of the central part 410, be bent in a height direction, and extend a specific length. One or more protrusions 450 may be provided in the central part 410. As illustrated in FIGS. 4A-4C, one of the protrusions 450 may extend from an upper widthwise surface of the left central area of the central part 410, be bent in a height direction, and extend a specific length, and the other protrusion 450 may extend from a lower widthwise surface of the right central area of the central part 410, be bent in a height direction, and extend a specific length. However, the number and locations of the protrusions 450 are not limited thereto. In some embodiments, one of the protrusions 450 may be omitted, and at least one other protrusion 450 may be further provided.

Figure 5A:
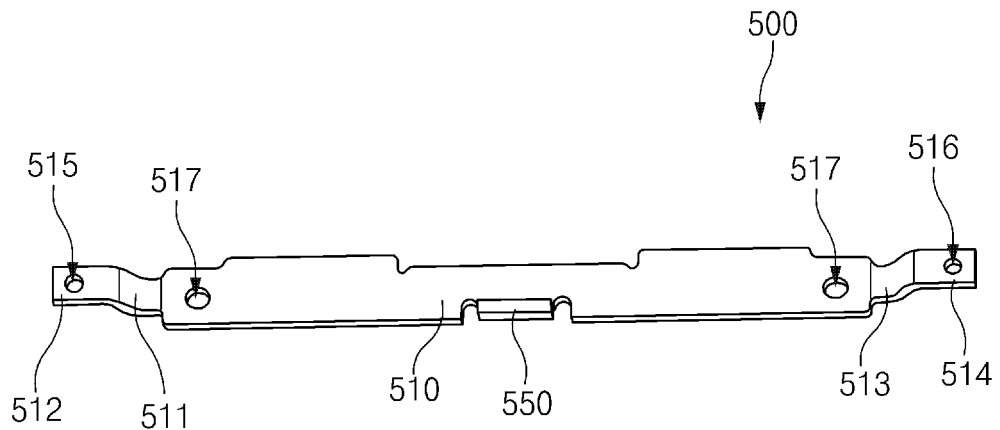
FIGS. 5A to 5C illustrate a side key bracket of a second form according to an embodiment of the present disclosure.
Figure 5B:
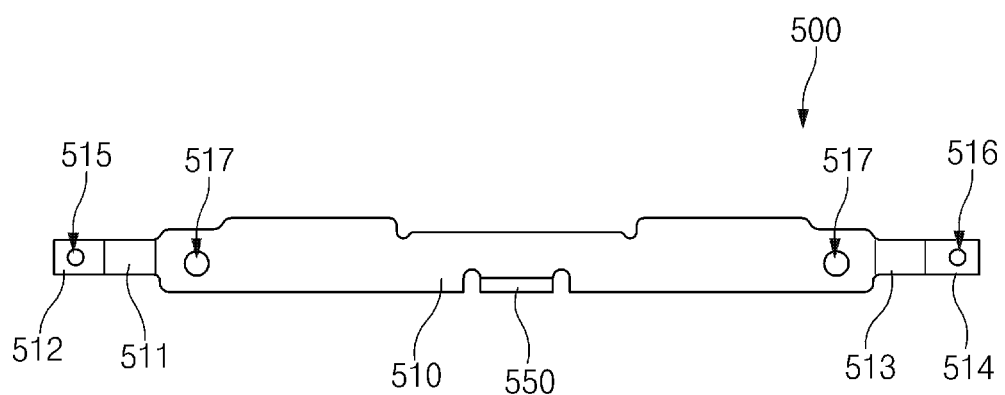
Figure 5C:
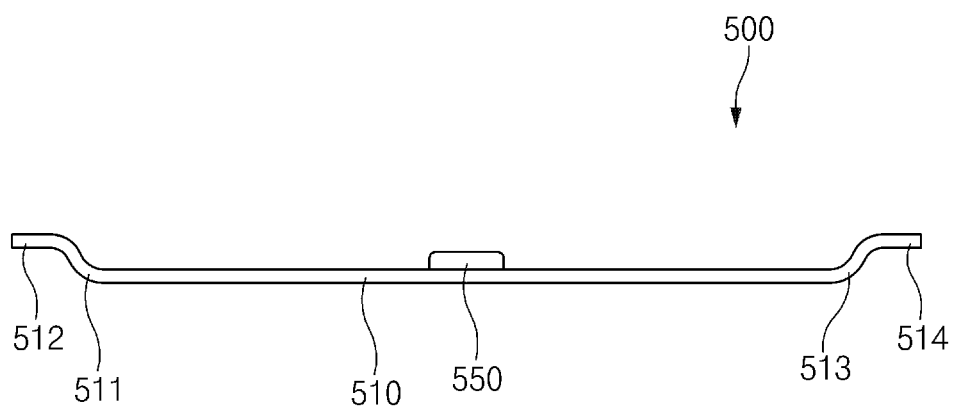

FIGS. 5A to 5C illustrate a side key bracket of a second form according to an embodiment of the present disclosure. FIG. 5A is a perspective view of a side key bracket of a second form. FIG. 5B is a plan view of a side key bracket of a second form. FIG. 5C is a side view of a side key bracket of a second form.

The elements of the side key bracket 500 of FIGS. 5A to 5C may be the same as or similar to the side key bracket 400 of FIGS. 4A to 4C. For example, the side key bracket 500 of FIGS. 5A to 5C may include a central part 510, a first extending part 511, a first peripheral part 512, a second extending part 513, a second peripheral part 514, and a protruding part 550, and may extend such that opposite peripheral areas of the side key bracket 500 are stepped in a height direction. For example, the first extending part 511 may extend from the central part 510 in a left lengthwise direction to be inclined upwards, the first peripheral part 512 may extend from the first extending part 511 in the left lengthwise direction to be substantially parallel to the central part 510, the second extending part 513 may extend from the central part 510 in a right lengthwise direction to be inclined upwards, and the second peripheral part 514 may extend from the second extending part 513 in the right lengthwise direction to be substantially parallel to the central part 510. Further, a first hole 515 is provided in the first peripheral part 512 and a second hole 516 is provided in the second peripheral part 514.

According to various embodiments, the side key bracket 500 of the second form illustrated in FIGS. 5A to 5C is used when the side key has two or more contact parts, and the side key bracket 400 of the first form illustrated in FIGS. 4A to 4C is used when the side key has one contact part. For example, the side key bracket 500 of the second form may be used in a side key to adjust a sound volume, and the side key bracket 400 of the first form may be used in a side key to turn on and off a screen of a display. The side key bracket 500 of the second form may be longer than the side key bracket 400 of the first form. Further, the side key bracket 500 of the second form may have two or more guide holes 517 that guide a seating location of the side key circuit board such that the two or more contact parts of the side key and the switch module may be stably aligned. FIGS. 5A and 5B illustrate a state in which the guide holes 517 are provided in a left central area and a right central area of the central part 510, respectively. As another example, the side key bracket 500 of the second form may be configured such that a protrusion 550 extends from an upper widthwise surface of a central area of the central part 510, is bent in a height direction, and extends a specific length.

Figure 6:
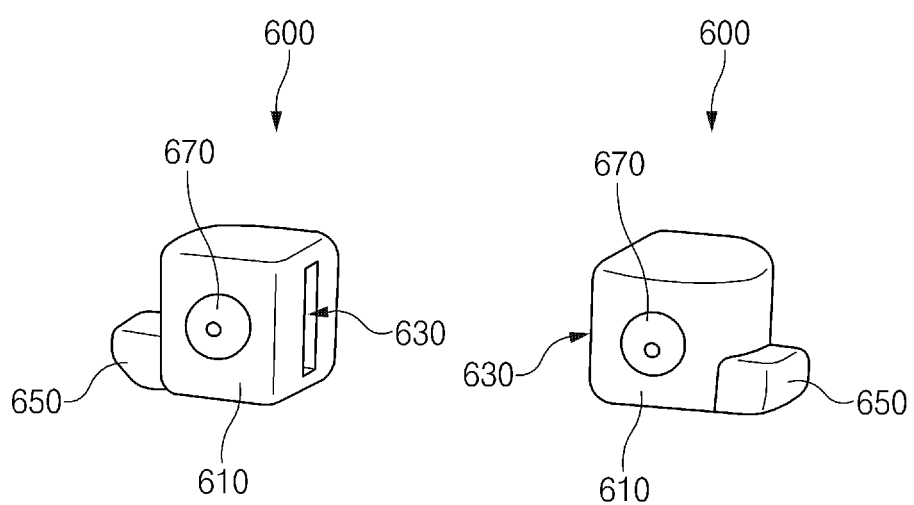
FIG. 6 illustrates a molded member of a first form according to an embodiment of the present disclosure.

FIG. 6 illustrates a molded member of a first form according to an embodiment of the present disclosure.

Referring to FIG. 6, the molded member 600 may include a body 610, a hook 650, and a boss 670. The body 610 may have a width that is the same as or similar to a coupling recess formed in the outer housing 110. An engaging recess 630 may be provided on one side surface of the body 610 such that a side key bracket (e.g., the side key bracket 400 or the side key bracket 500) may be engaged with the engaging recess 630. The engaging recess 630 may correspond to the length and width of a lengthwise side surface of the side key bracket. According to an embodiment, the molded member 600 may be coupled to the side key bracket through insert molding. In this case, the engaging recess 630 formed on one side surface of the body 610 may be provided as a result of insert molding.

The hook 650 may have a shape that extends from a lower end of one side surface of the body 610 and protrudes by a specific length. The hook 650 may be provided on a side surface of the body 610 that is opposite to a side surface, on which the engaging recess 630 is formed. The hook 650 may be hook-coupled to a stopper formed on one side surface of the coupling recess provided in the outer housing. As the hook 650 is hook-coupled to the stopper, the side key bracket may be fixed so as not to be movable towards the front and rear sides of the outer housing.

The boss 670 protrudes from one side surface of the molded member 600 such that the molded member 600 may be smoothly coupled to the coupling recess provided in the outer housing. For example, when the molded member 600 is pressed so as to be coupled to the coupling recess, it may be coupled to the coupling recess, by allowing the boss 670 to point-contact one surface of the coupling recess rather than by allowing the side surfaces of the body 610 to surface-contact the side surfaces of the coupling recess. At least one boss 670 may be provided on at least one surface of the body 610. FIG. 6 illustrates a state in which the boss 670 is provided on a surface of the molded member 600, except for the side surfaces on which the engaging recess 630 and the hook 650 are provided. From the shape in which the molded member 600 is coupled to the side key bracket, it is preferable that the boss 670 is provided on a side surface of the body 610, which faces a height direction of the side key bracket (e.g. towards the side surface of the outer housing).

Figure 7:
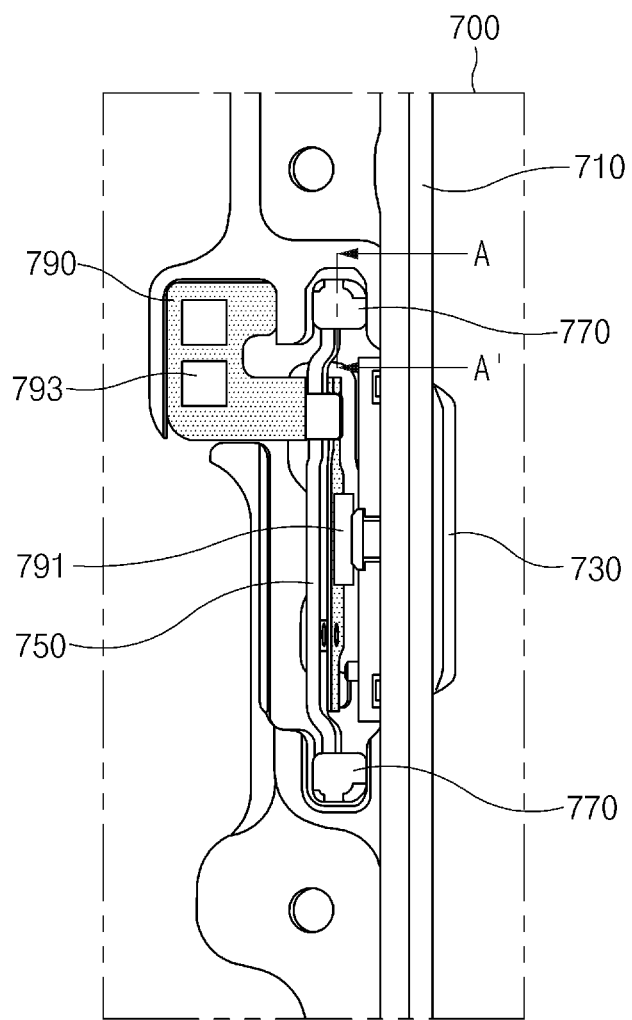
FIG. 7 illustrates a side key of a first form, which is coupled to an outer housing according to an embodiment of the present disclosure.

FIG. 7 illustrates a side key of a first form, which is coupled to an outer housing according to an embodiment of the present disclosure. An area 700 as illustrated in FIG. 7 is an enlargement of the left peripheral area 191 of FIG. 2.

Referring to FIG. 7, a side key (e.g., the first side key 171) may be coupled to one surface of the outer housing 710. The side key may include a contact part 730 that is exposed to the outside through a through-hole formed on one side surface of the outer housing 710, a side key circuit board 790 that includes a switch module 791 that contacts the contact part 730 based on whether the contact part 730 is pressed, a side key bracket 750, in which the side key circuit board 790 is seated, and molded members 770 that are coupled to opposite ends of the side key bracket 750 and are coupled to the outer housing 710. According to an embodiment, the side key is mounted on one surface of the outer housing 710 while being arranged generally perpendicular to a thickness direction (e.g., towards the front and rear sides of the outer housing 710) of an electronic device 100, and may be provided on a side surface or a rear surface of a display 150 to avoid interference with the display provided in the electronic device.

The contact part 730 may be formed of a material having a specific elasticity. As the contact part 730 is formed of an elastic material, and if a user presses the contact part 730 and removes the pressing force, the contact part 730 may return to an original location by an elastically restoring force. Accordingly, the user may press the side key repeatedly.

The side key circuit board 790 may include a first part that is seated in a space provided by a step that extends in a height direction of the side key bracket 750, and a second part that extends from the first part to the inside of the outer housing 710 and is connected to a main printed circuit board. The switch module 791 that is operated while contacting the contact part 730 to generate an electrical signal is provided in the first part, and a connection terminal 793 that delivers the generated electrical signal to the main printed circuit board is provided in the second part.

The side key bracket 750 provides a space, in which the side key circuit board 790 is seated, and may fix and support the side key circuit board 790. The side key bracket 750 may be coupled to the outer housing 710 through the molded members 770 to be perpendicular to directions that face the front and rear sides of the outer housing 710.

The molded members 770 may be coupled to opposite ends of the side key bracket 750, and may be coupled to the outer housing 710. The molded members 770 may be coupled to the coupling recesses formed in the outer housing 710 to be fixed such that the side key bracket 750 is not pushed rearwards (e.g., towards the inner side of the outer housing 710) when the contact part 730 of the side key is pressed. Further, as the molded members 770 may correspond to the width of the coupling recesses to reduce an assembly deviation, the side key bracket 750 may be fixed so as not to be moved towards the front and rear sides of the outer housing 710.

Figure 8:
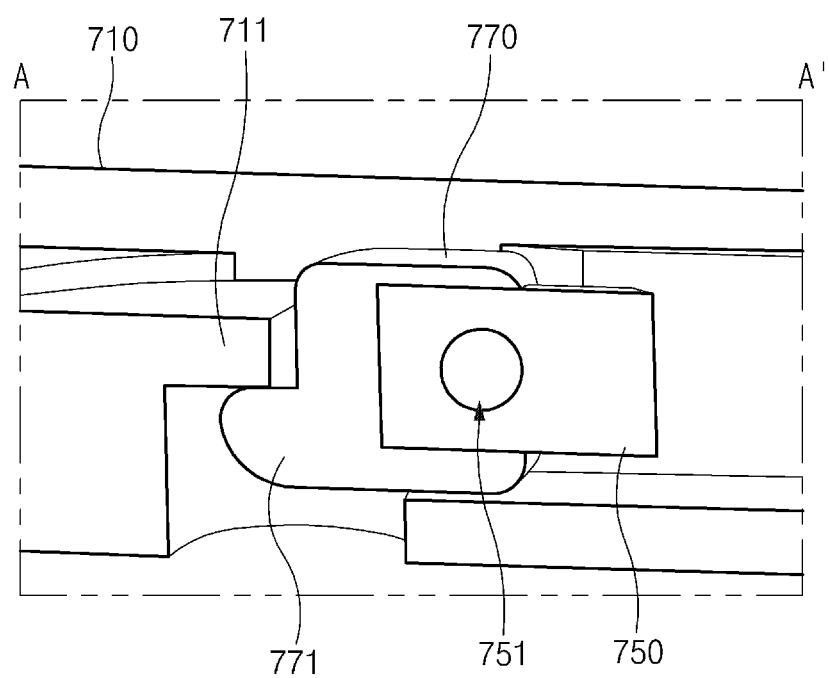
FIG. 8 is a sectional view taken along line A-A' of FIG. 7 according to an embodiment of the present disclosure.

FIG. 8 is a sectional view taken along line A-A' of FIG. 7 according to an embodiment of the present disclosure.

Referring to FIG. 8, the molded members 770 coupled to opposite ends of the side key bracket 750 may include a hook 771 (e.g., the hook 650) that extends form a lower end of one side surface of a body (e.g., the body 610) and protrudes a specific length. The hook 771 may be hook-coupled to a stopper 711 provided in the outer housing 710. The stopper 711 may be formed on one surface of a coupling recess provided in the outer housing 710. The stopper 711 may extend from one surface of the coupling recess that faces a lengthwise side surface of the side key bracket 750 by a specific length. As the hook 771 is hook-coupled to the stopper 711, the side key bracket 750 may be fixed so as not to be separated towards the front side of the outer housing 710. As another example, at least one hole 751 for increasing a coupling force with the molded member 770 may be provided in a peripheral part (e.g., the first peripheral part 412 and 512 or the second peripheral part 414 and 514) of the side key bracket 750.

Figure 9:
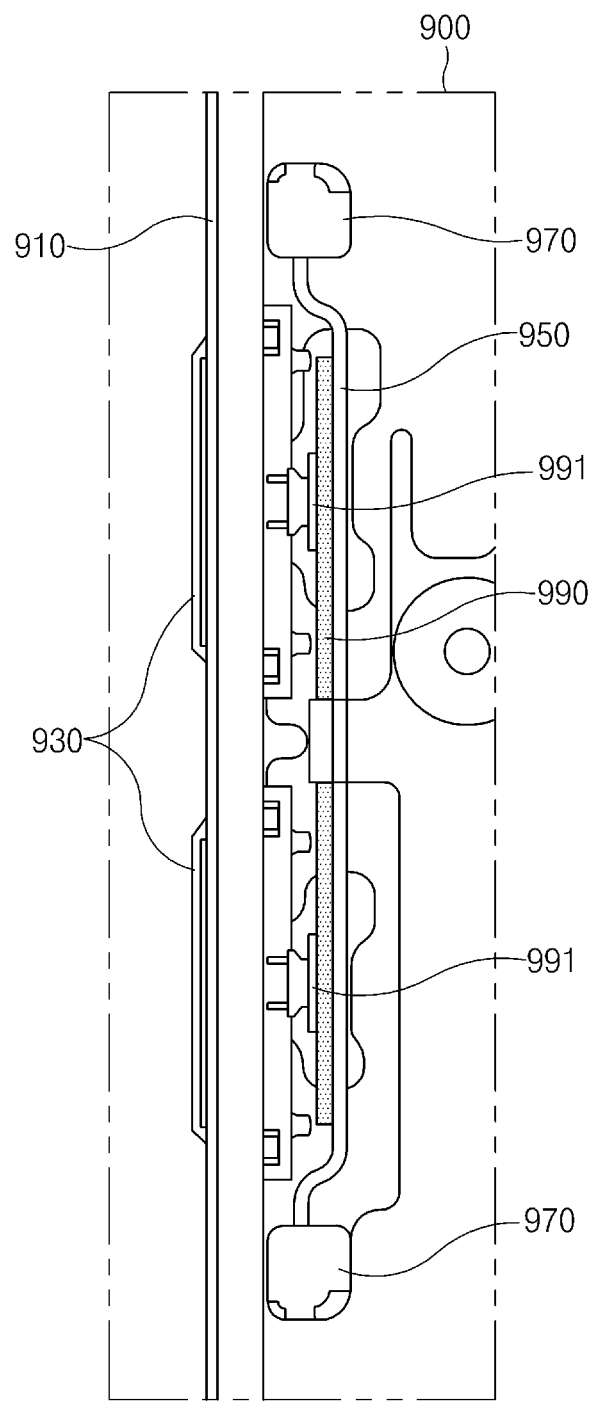
FIG. 9 illustrates a side key of a second form, which is coupled to an outer housing according to an embodiment of the present disclosure.

FIG. 9 illustrates a side key of a second form, which is coupled to an outer housing according to an embodiment of the present disclosure. An area 900 as illustrated in FIG. 9 is an enlargement of the right peripheral area 193 of FIG. 2. The coupling form of the side key of FIG. 9 may be the same as or similar to the coupling form of the side key of FIGS. 7 and 8. In FIG. 9, a description of the same or similar components as those of FIGS. 7 and 8 will be omitted.

Referring to FIG. 9, a side key (e.g., the second side key 173) may be coupled to one surface of the outer housing 910.

The side key may include a plurality of contact parts 930 that are exposed to the outside through through-holes formed on one side surface of the outer housing 910, a side key circuit board 990 that includes a plurality of switch modules 991 that contact the contact parts 930, respectively, based on whether the contact part 930 is pressed, a side key bracket 950, in which the side key circuit board 990 is seated, and molded members 970 that are coupled to opposite ends of the side key bracket 950 and are coupled to the outer housing 910.

The plurality of contact parts 930 may be formed of a material having a specification elasticity, and may be pressed by the user individually or at the same time. The contacts parts 930 may contact different switch modules 991 that are electrically isolated from each other, respectively, when being pressed. The switch modules 991 may be integrally formed and the plurality of contact parts 930 may contact the switch modules 991 at different contact points. In this case, the contact points may be connected to different circuit lines, respectively, to be electrically isolated from each other.

The side key circuit board 990 may be seated in a space that is defined by a step formed in a height direction of the side key bracket 950. According to an embodiment, switch modules 991 may be arranged in opposite peripheral areas of the side key circuit board 990. The side key circuit board 990 may include connection terminals that deliver electrical signals generated by the switch modules 991 to the main printed circuit board.

Figure 10:
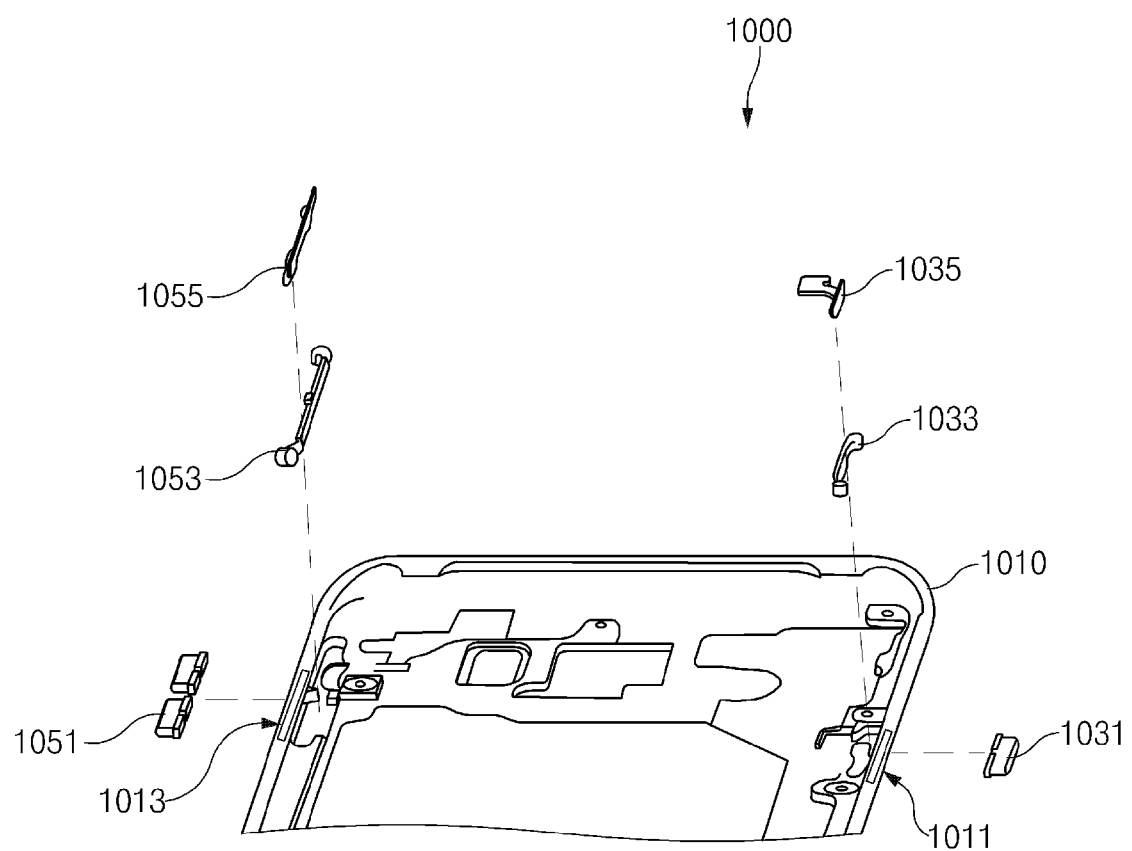
FIG. 10 illustrates an assembly view of a side key of a first form and a side key of a second form that are coupled to an outer housing according to an embodiment of the present disclosure.

FIG. 10 illustrates an assembly view of a side key of a first form and a side key of a second form that are coupled to an outer housing according to an embodiment of the present disclosure.

Referring to FIG. 10, the electronic device 1000 may be configured such that side keys are coupled to peripheral areas of the outer housing 1010. In a process of coupling the side keys, a side key circuit board may be seated in a side key bracket, and the side key bracket having opposite ends, to which molded members are coupled, may be coupled to coupling recesses formed in the peripheral areas of the outer housing 1010 to be perpendicular to directions that face the front and rear sides of the outer housing 1010. Further, the contact parts of the side keys may be inserted into and coupled to the through-holes formed on the side surfaces of the outer housing 1010.

As illustrated in FIG. 10, the side key having one contact part of a first form is coupled to a right peripheral area of the outer housing 1010, and the side key having two contact parts of a second form is coupled to a left peripheral area of the outer housing 1010. For example, a side key circuit board 1035 may be seated in a first side key bracket 1033, and the side key bracket 1033 having opposite ends, to which the molded members are coupled, may be coupled to coupling recesses formed in the right peripheral area of the outer housing 1010 to be perpendicular to the directions that face the front and rear sides of the outer housing 1010. Further, the contact part 1031 of the side key of the first form may be inserted into and coupled to the first through-hole 1011 formed on the right side surface of the outer housing 1010. Further, a second side key circuit board 1055 may be seated in a second side key bracket 1053, and the second side key bracket 1053 having opposite ends, to which the molded members are coupled, may be coupled to coupling recesses formed in the left peripheral area of the outer housing 1010 to be perpendicular to the directions that face the front and rear sides of the outer housing 1010. Further, the contact part 1051 of the side key of the second form may be inserted into and coupled to the second through-hole 1013 formed on the left side surface of the outer housing 1010.

According to various embodiments, when the molded member is coupled to the coupling recess, a hook (e.g., the hook 771) formed on one side surface of the molded member may be hook-coupled to a stopper (e.g., the stopper 711) formed on one side surface of the coupling recess. In this case, in order that both the hooks of the molded members coupled to opposite ends of the side key bracket may be hook-coupled to the stoppers, the molded member coupled to one end of the side key bracket may be inserted first, and the molded member coupled to an opposite end of the side key bracket may be pressed towards the rear surface of the outer housing 1010 to be coupled.

Figure 11:
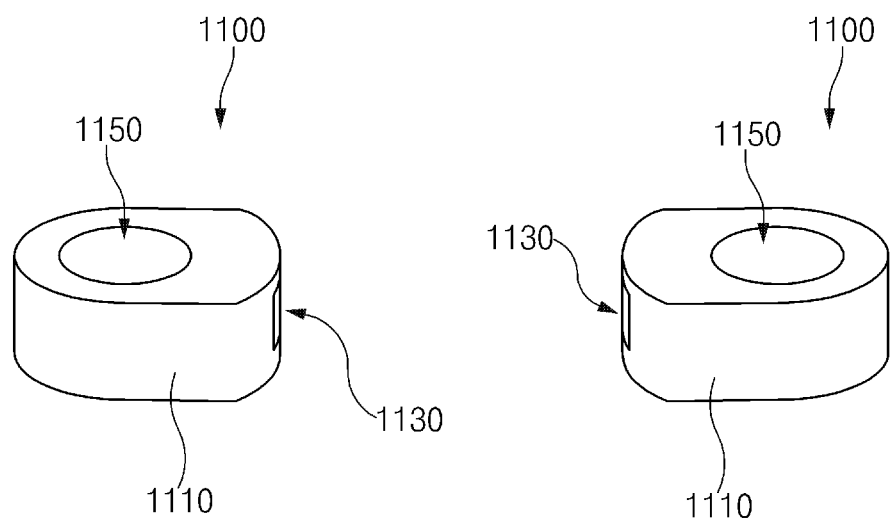
FIG. 11 illustrates a molded member of a second form according to an embodiment of the present disclosure.

FIG. 11 illustrates a molded member of a second form according to an embodiment of the present disclosure.

The molded member 1100 may be coupled to an outer housing 110 through a screw member. For example, the molded member 1100 may be inserted into a coupling recess formed in the outer housing, and a screw member may screw-couple the outer housing and the molded member 1100 through a screw-hole formed in the molded member 1100.

Referring to FIG. 11, the body 1110 of the molded member 1100 may have a width that is the same as or similar to the width of the coupling recess provided in the outer housing. An engaging recess 1130 may be provided on one side surface of the body 1110 such that a side key bracket (e.g., the side key bracket 400 or the side key bracket 500) may be engaged with the engaging recess 1130. The engaging recess 1130 may correspond to the length and width of a lengthwise side surface of the side key bracket. According to an embodiment, the molded member 1100 may be coupled to the side key bracket through insert molding.

The body 1110 may have a screw hole 1150 that passes through the front and rear surfaces of the body 1110 such that the screw member may be inserted into the screw hole 1150. The screw hole 1150 may pass through the opposite side surfaces of the body 1110, and it is preferable that the screw hole 1150 may pass through the front and rear surfaces of the body 1110 to more stably prevent the side key bracket from being moved towards the front and rear sides of the outer housing. According to an embodiment, a screw thread or a screw groove may be formed on an inner peripheral surface of the body 1110 having the screw hole 1150.

The body 1110 may also include a boss that protrudes from one side surface of the molded member 1100 such that the molded member 1100 may be smoothly coupled to the coupling recess provided in the outer housing.

Figure 12A:
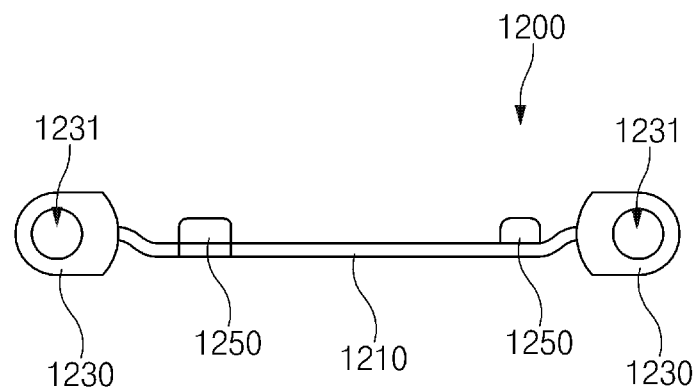
FIGS. 12A and 12B illustrate a side key bracket, to which molded members of a second form are coupled, according to an embodiment of the present disclosure.
Figure 12B:
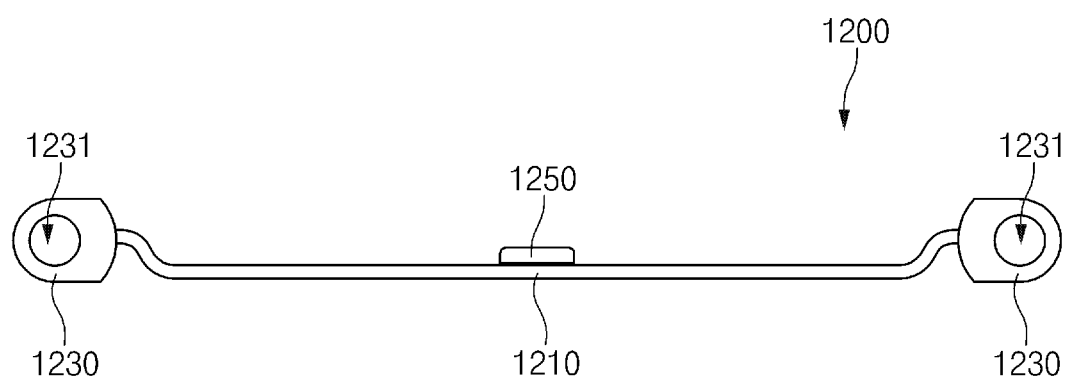

FIGS. 12A and 12B illustrate a side key bracket, to which molded members of a second form are coupled, according to an embodiment of the present disclosure. The side keys of FIGS. 12A and 12B may be the same as or similar to the side keys of FIGS. 3A and 3B. In FIGS. 12A and 12B, a description of the components that are the same or similar to those of FIGS. 3A and 3B may be omitted.

Referring to FIGS. 12A and 12B, the side key 1200 may include a side key bracket 1210 and molded members 1230. The side key 1200 may further include a contact part that is exposed through a through-hole of an outer housing, and a side key circuit board that includes a switch module that contacts the contact part based on whether the contact part is pressed.

The side key bracket 1210 may correspond to the length and width of the side key circuit board, and may extend such that opposite peripheral areas of the side key bracket 1210 may be stepped in a height direction thereof (e.g., a widthwise direction of the outer housing). The side key bracket 1210 may be formed of a material (e.g., stainless steel) having a specific strength. The side key bracket 1210 may also include at least one protrusion 1250 that extends from one side surface of the side key bracket 1210, is bent in a height direction, and extends a specific length.

The molded members 1230 may be coupled to opposite ends of the side key bracket 1210, and may be coupled to an outer housing. The molded member 1230 may be inserted into a coupling recess formed in the outer housing, and a screw member may screw-couple the outer housing and the molded member 1230 through a screw-hole 1231 formed in the molded member 1230. The screw hole 1231 may pass through the front and rear surfaces of the molded member 1230. The molded members 1230 may be formed of any suitable plastic (e.g., polycarbonate (PC)).

Figure 13A:
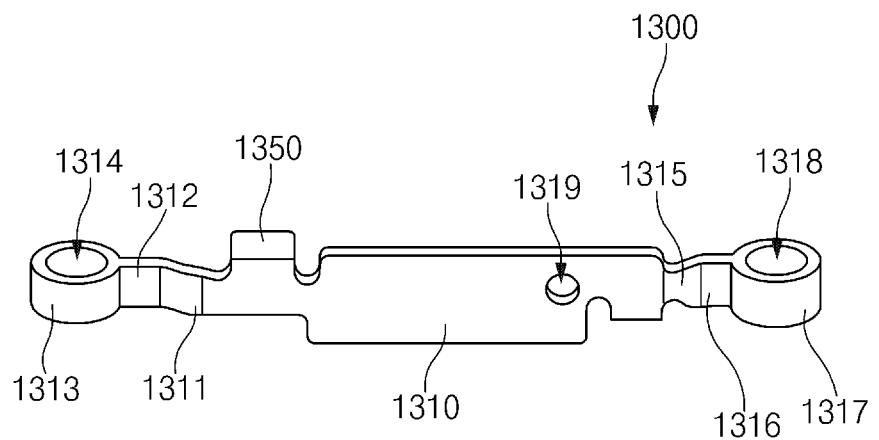
FIGS. 13A to 13C illustrate a side key bracket of a third form according to an embodiment of the present disclosure.
Figure 13B:
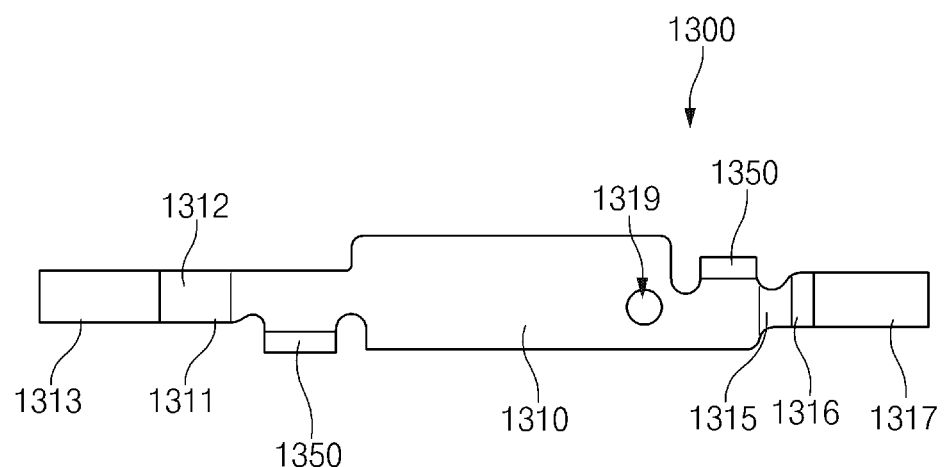
Figure 13C:
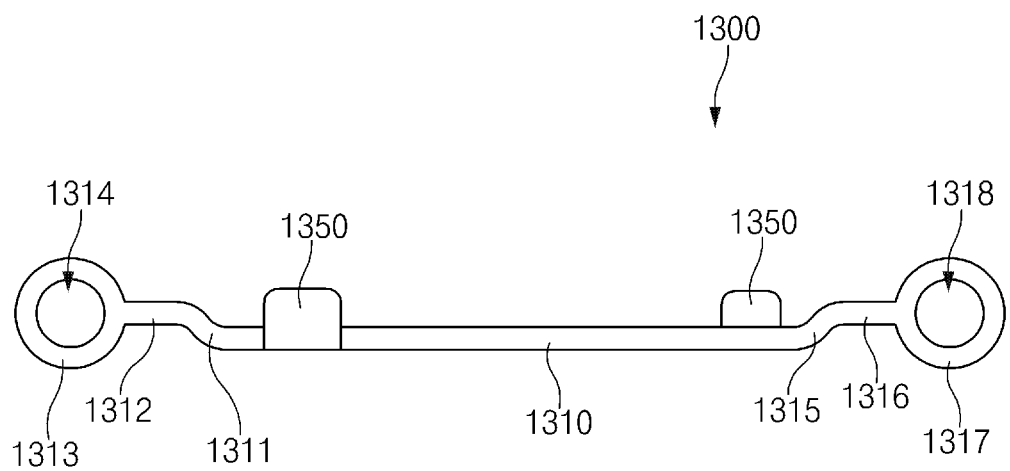

FIGS. 13A to 13C illustrate a side key bracket of a third form according to an embodiment of the present disclosure. FIG. 13A is a perspective view of a side key bracket of a third form. FIG. 13B is a plan view of a side key bracket of a third form. FIG. 13C is a side view of a side key bracket of a third form.

Referring to FIGS. 13A to 13C, the side key bracket 1300 may include a central part 1310, a first extending part 1311, a second extending part 1312, a first peripheral part 1313, a third extending part 1315, a fourth extending part 1316, a second peripheral part 1317, and a protruding part 1350. According to an embodiment, the side key bracket 1300 may extend such that opposite peripheral areas of the side key bracket 1300 are stepped in a height direction. For example, the side key bracket 1300 may include the first extending part 1311 that extends from the central part 1310 in a left lengthwise direction thereof to be inclined upward, the first extending part 1312 that extends from the first extending part 1311 in a left lengthwise direction thereof to be substantially parallel to the central part 1310, the first peripheral part 1313 that extends from the second extending part 1312 such that a bottom surface thereof has a cylindrical shape that faces a widthwise direction of the side key bracket 1300, the third extending part 1315 that extends from the central part 1310 in a right lengthwise direction thereof to be inclined upward, the fourth extending part 1316 that extends from the third extending part 1315 in a right lengthwise direction thereof to be substantially parallel to the central part 1310, and the second peripheral part 1317 that extends from the fourth extending part 1316 such that a bottom surface thereof has a cylindrical shape that faces a widthwise direction of the side key bracket 1300.

The first peripheral part 1313 and the second peripheral part 1317 may be coupled to molded members (e.g., the molded members 1100), and at least one hole may be provided to increase a coupling force with a screw member when the screw member is inserted into and screw-coupled to a screw hole (e.g., the screw hole 1150) formed in the molded member. FIGS. 13A-13C illustrate a state in which a first hole 1314 is formed in the first peripheral part 1313 and a second hole 1318 is formed in the second peripheral part 1317. The first hole 1314 and the second hole 1317 provided in the first peripheral part 1313 and the second peripheral part 1317, respectively, may face the same direction as the direction of the screw hole formed in the molded member. For example, the first hole 1314 and the second hole 1317 may pass through the upper and lower surfaces (e.g., the two bottom surfaces of the cylindrical shape) of the first peripheral part 1313 and the second peripheral part 1317, respectively.

According to various embodiments, the central part 1310 may include a guide hole 1319 that guides a seating location of the side key circuit board such that the switch module provided between the contact part of the side key and the side key circuit board may be aligned when the side key circuit board is seated. The protrusion 1350 may extend from one side surface of the central part 1310, be bent in a height direction, and extend a specific length.

Figure 14A:
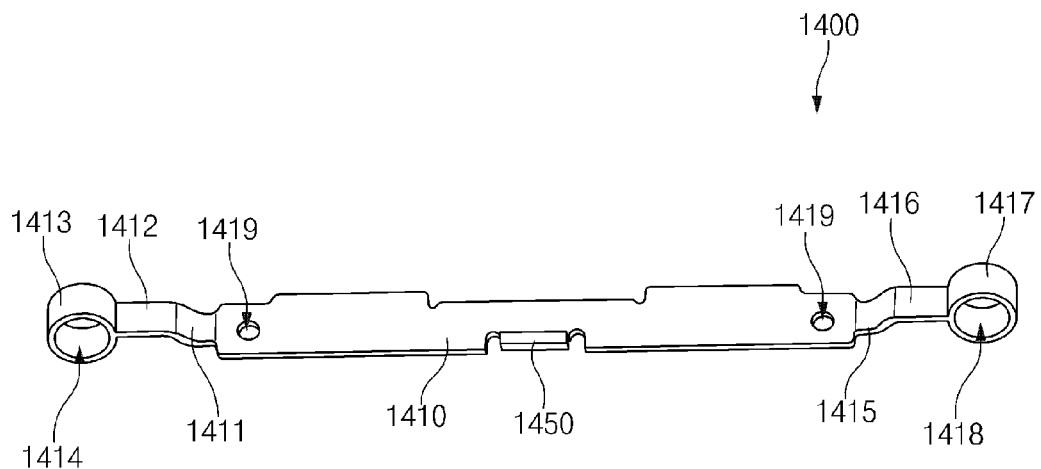
FIGS. 14A to 14C illustrate a side key bracket of a fourth form according to an embodiment of the present disclosure.
Figure 14B:
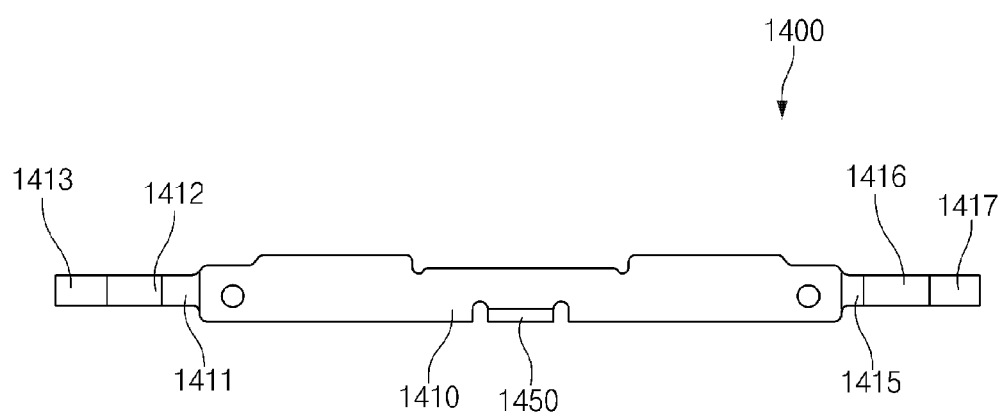
Figure 14C:
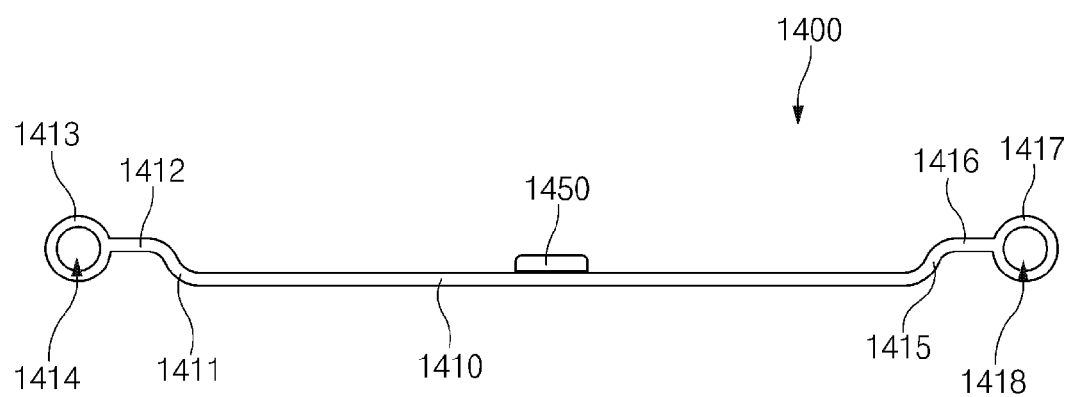

FIGS. 14A to 14C illustrate a side key bracket of a fourth form according to an embodiment of the present disclosure. FIG. 14A is a perspective view of a side key bracket of a fourth form. FIG. 14B is a plan view of a side key bracket of a fourth form. FIG. 14C is a side view of a side key bracket of a fourth form.

The side key bracket 1400 of FIGS. 14A to 14C may be the same as or similar to the side key bracket 1300 of FIGS. 13A to 13C. For example, the side key bracket 1400 illustrated in FIGS. 14A to 14C may include a central part 1410, a first extending part 1411, a second extending part 1412, a first peripheral part 1413, a third extending part 1415, a fourth extending part 1416, a second peripheral part 1417, and a protruding part 1450, and may extend such that opposite peripheral areas thereof are stepped in a height direction. For example, the side key bracket 1400 may include the first extending part 1411 that extends from the central part 1410 in a left lengthwise direction thereof to be inclined upward, the second extending part 1412 that extends from the first extending part 1411 in a left lengthwise direction thereof to be substantially parallel to the central part 1410, the first peripheral part 1413 that extends from the second extending part 1412 such that a bottom surface thereof has a cylindrical shape that faces a widthwise direction of the side key bracket 1400, the third extending part 1415 that extends from the central part 1410 in a right lengthwise direction thereof to be inclined upward, the fourth extending part 1416 that extends from the third extending part 1415 in a right lengthwise direction thereof to be substantially parallel to the central part 1410, and the second peripheral part 1417 that extends from the fourth extending part 1416 such that a bottom surface thereof has a cylindrical shape that faces a widthwise direction of the side key bracket 1400. Further, a first hole 1414 is provided in the first peripheral part 1413 and a second hole 1418 is provided in the second peripheral part 1417.

According to various embodiments, the side key bracket 1400 of the fourth form illustrated in FIGS. 14A to 14C is used when the side key has two contact parts, and the side key bracket 1300 of the third form illustrated in FIGS. 13A to 13C is used when the side key has one contact part. The side key bracket 1400 of the fourth form may be longer than the side key bracket 1300 of the third form. Further, the side key bracket 1400 of the fourth form may have two or more guide holes 1419 that guide a seating location of the side key circuit board such that the two or more contact parts of the side key and the switch module may be stably aligned. As another example, the side key bracket 1400 of the fourth form may be configured such that the protruding part 1450 extends from an upper widthwise surface of a central area of the central part 1410, is bent in a height direction, and extends a specific length.

Figure 15A:
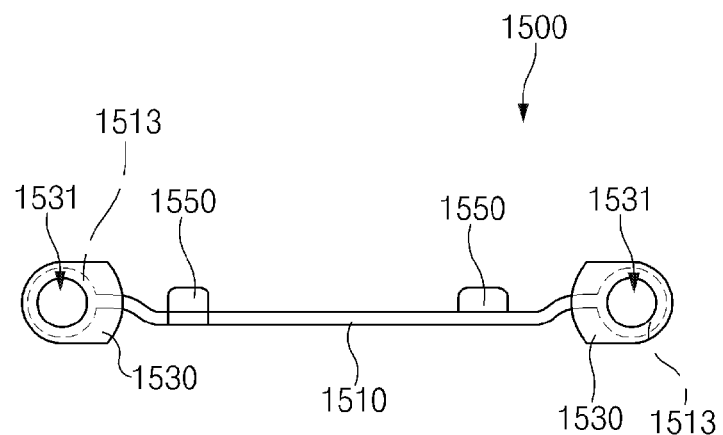
FIG. 15A illustrates a side key bracket of a third form, to which a molded member of a second form is coupled, according to an embodiment of the present disclosure.
Figure 15B:
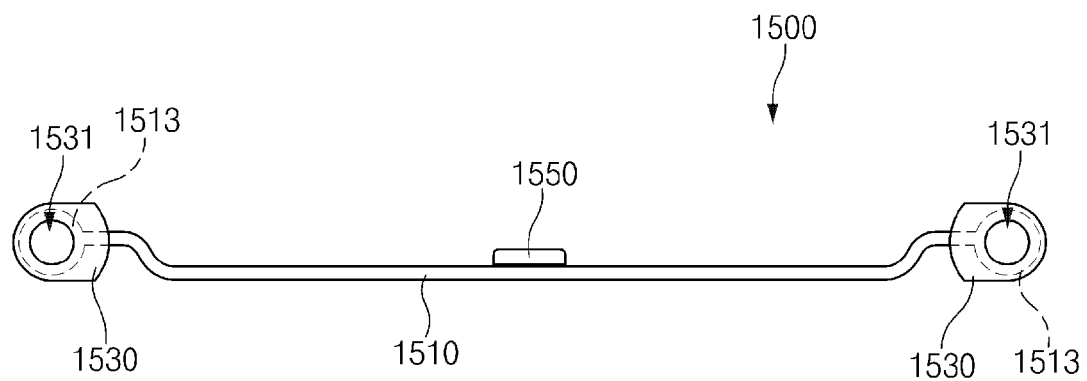
FIG. 15B illustrates a side key bracket of a fourth form, to which a molded member of a second form is coupled, according to an embodiment of the present disclosure.

FIG. 15A illustrates a side view of a side key bracket of a third form, to which a molded member of a second form is coupled, according to an embodiment of the present disclosure. FIG. 15B illustrates a side view of a side key bracket of a fourth form, to which a molded member of a second form is coupled, according to an embodiment of the present disclosure. In FIGS. 15A and 15B, a description of the components that are the same or similar to those previously described will be omitted.

Referring to FIGS. 15A and 15B, the side key 1500 may include a side key bracket 1510 and molded members 1530. The side key 1500 may further include a contact part that is exposed through a through-hole of an outer housing, and a side key circuit board that includes a switch module that contacts the contact part based on whether the contact part is pressed.

The side key bracket 1510 may correspond to the length and width of the side key circuit board, and may extend such that opposite peripheral areas of the side key bracket 1510 may be stepped in a height direction thereof (e.g., a widthwise direction of the outer housing). The side key bracket 1510 may be formed of a material (e.g., stainless steel) having a specific strength. As another example, the side key bracket 1510 may include at least one protrusion part 1550 that extends from one side surface of the side key bracket 1510, is bent in a height direction, and extends a specific length. As another example, peripheral parts 1513 at opposite ends of the side key bracket 1510 may have a cylindrical shape. For example, the bottom surfaces of the peripheral parts 1513 may have a cylindrical shape that faces a widthwise direction of the side key bracket 1510. Further, each of the peripheral parts 1513 may include at least one hole 1531 that passes through the upper and lower surfaces (e.g., the two bottom surfaces of the cylinder) thereof.

The molded members 1530 may be coupled to opposite ends of the side key bracket 1510, and may be coupled to an outer housing. FIGS. 15A and 15B illustrate a state in which the molded members 1530 are coupled to the peripheral parts 1513 of the side key bracket 1510. Each of the molded members 1530 may have the screw hole 1531. As another example, when the molded member 1530 is coupled to the corresponding peripheral part 1513 of the side key bracket 1510, the screw hole 1531 of the molded member 1530 may face the same direction as the hole formed in the peripheral part 1510. According to an embodiment, the molded member 1530 may be inserted into a coupling recess formed in the outer housing, and a screw member may screw-couple the outer housing and the molded member 1530 through the screw-hole 1531 formed in the molded member 1530. The molded members 1530 may be formed of plastic (e.g., polycarbonate (PC)).

Figure 16:
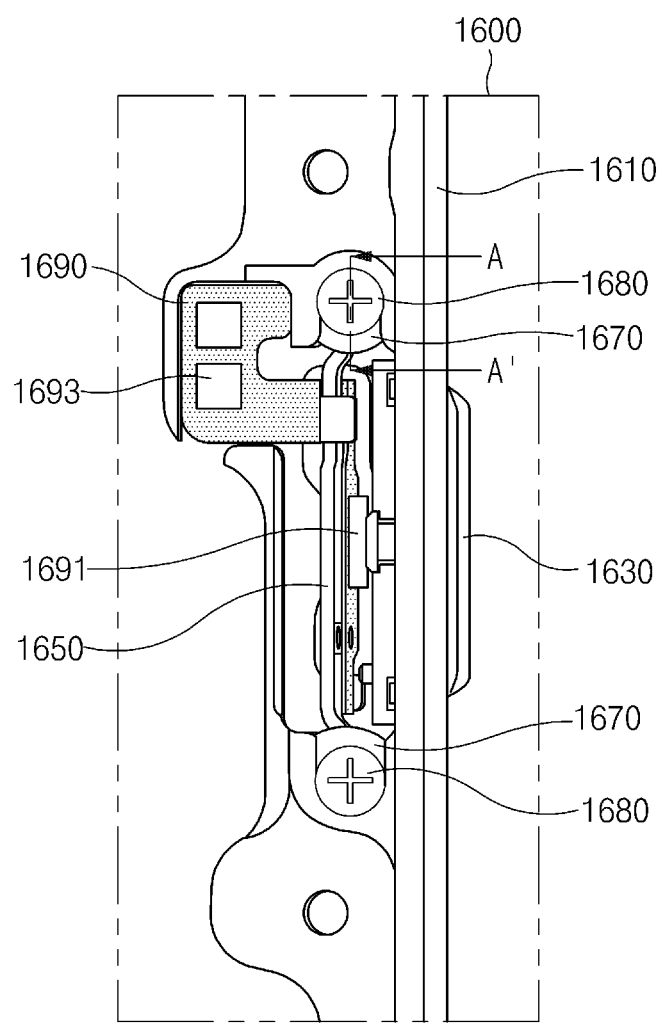
FIG. 16 illustrates a side key of a third form, which is coupled to an outer housing according to an embodiment of the present disclosure.

FIG. 16 illustrates a side key of a third form, which is coupled to an outer housing according to an embodiment of the present disclosure. In FIG. 16, an area 1600 as illustrated is an enlargement of the right peripheral area 191 of FIG. 2. The assembly state of the side key of FIG. 16 may be similar to the assembly state of FIG. 7. In FIG. 16, a description of the components that are the same or similar to those previously described will be omitted.

Referring to FIG. 16, a side key (e.g., the first side key 171) may be coupled to one surface of the outer housing 1610. The side key may include a contact part 1630 that is exposed to the outside through a through-hole formed on one side surface of the outer housing 1610, a side key circuit board 1690 that includes a switch module 1691 that contacts the contact part 1630 based on whether the contact part 1630 is pressed, a side key bracket 1650, in which the side key circuit board 1690 is seated, and molded members 1670 that are coupled to opposite ends of the side key bracket 1650 and are coupled to the outer housing 1610.

The contact part 1630 may be formed of a material having a specific elasticity. As the contact part 1630 is formed of an elastic material, if a user presses the contact part 1630 and removes the pressing force, the contact part 1630 returns to an original location by an elastic restoring force.

The side key circuit board 1690 may include a first part that is seated in a space provided by a step that extends in a height direction of the side key bracket 1650, and a second part that extends from the first part to the inside of the outer housing 1610 and is connected to a main printed circuit board. The switch module 1691 that is operated while contacting the contact part 1630 to generate an electrical signal is provided in the first part, and a connection terminal part 1693 that delivers the generated electrical signal to the main printed circuit board is provided in the second part.

The side key bracket 1650 provides a space, in which the side key circuit board 1690 is seated, and may fix and support the side key circuit board 1690. The side key bracket 1650 may be perpendicular to directions that face the front and rear sides of the outer housing 1610.

The molded members 1670 are coupled to opposite ends of the side key bracket 1650, and may be coupled to an outer housing 1610. The molded member 1670 may be inserted into a coupling recess provided in the outer housing, and a screw member 1680 may be inserted through the screw hole formed in the molded member to screw-couple the outer housing and the molded member 1670.

Figure 17:
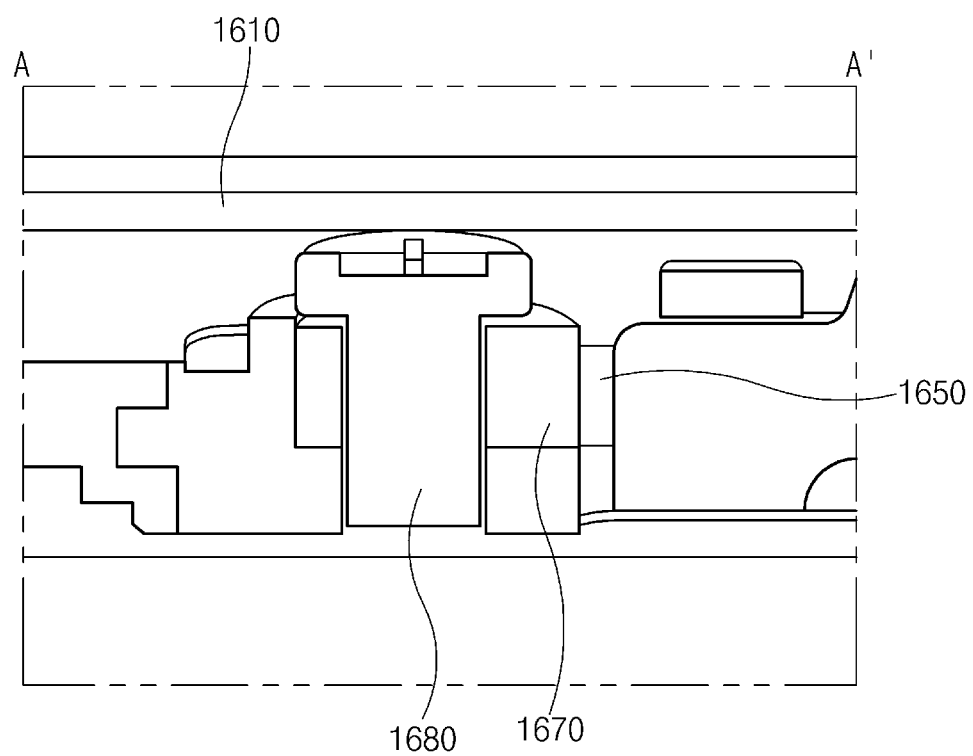
FIG. 17 is a sectional view taken along line A-A' of FIG. 16 according to an embodiment of the present disclosure.

FIG. 17 is a sectional view taken along line A-A' of FIG. 16 according to an embodiment of the present disclosure.

Referring to FIG. 17, each of the molded members 1670 coupled to the opposite ends of the side key bracket 1650 may have a screw hole (e.g., the screw hole 1150) that passes through the front and rear surfaces of a body (e.g., the body 1110). Further, a screw hole may be provided in the coupling recess, into which the body of the molded member 1670 is inserted, of the outer housing 1610. For example, when the body of the molded member 1670 is inserted into the coupling recess provided in the outer housing 1610, a screw hole may be provided on the rear surface of the outer housing 1610 that faces the body of the molded member 1670.

According to an embodiment, when the body of the molded member 1670 is inserted into the coupling recess provided in the outer housing 1610, the screw hole provided in the molded member 1670 and the screw hole provided near the coupling recess in the outer housing 1610 may be aligned with each other. Accordingly, the screw member 1680 may be inserted through the aligned screw holes to screw-couple the molded member 1670 to the outer housing 1610.

Figure 18:
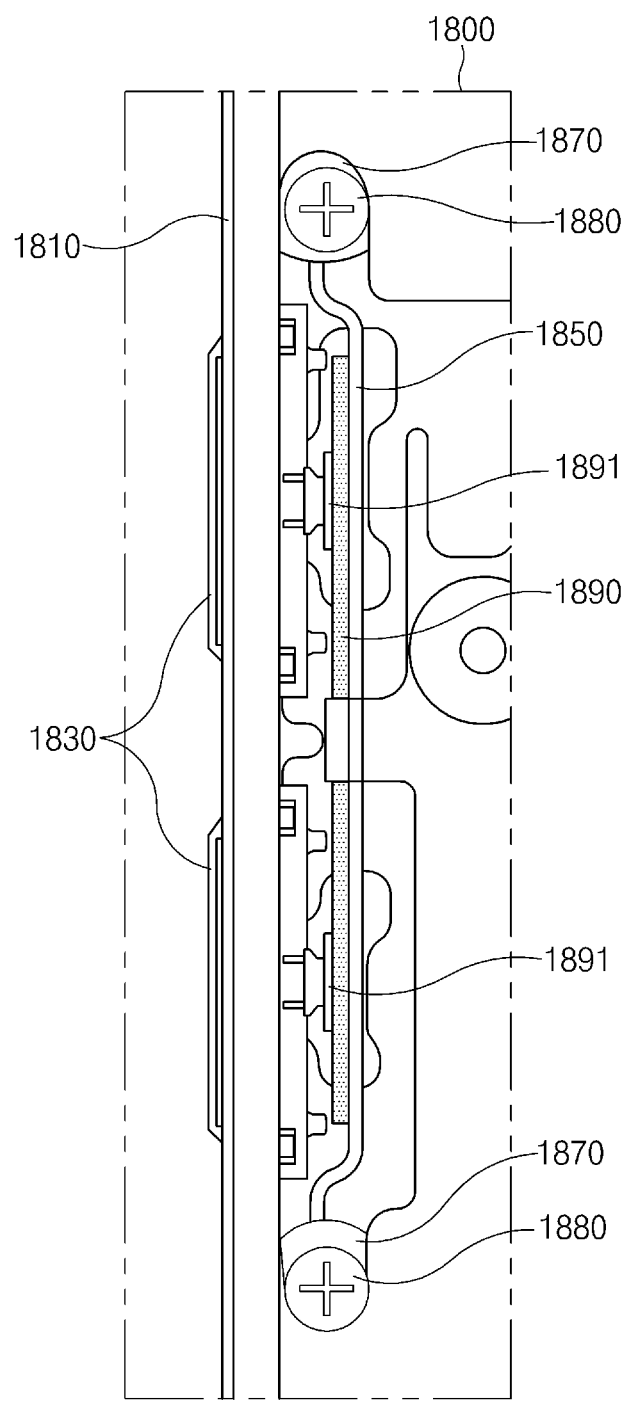
FIG. 18 illustrates a side key of a fourth form, which is coupled to an outer housing according to an embodiment of the present disclosure.

FIG. 18 illustrates a side key of a fourth form, which is coupled to an outer housing according to an embodiment of the present disclosure. In FIG. 18, an area 1800 as illustrated is an enlargement of the right peripheral area 193 of FIG. 2. The coupling form of the side key of FIG. 18 may be the same as or similar to the coupling form of the side key of FIGS. 16 and 17. In FIG. 18, a description of the components that are the same or similar to those previously described with regards to those of FIGS. 16 and 17 will be omitted.

Referring to FIG. 18, a side key (e.g., the second side key 173) may be coupled to one surface of the outer housing 1810. The side key may include a plurality of contact parts 1830 that are exposed to the outside through through-holes formed on one side surface of the outer housing 1810, a side key circuit board 1890 that includes a plurality of switch modules 1891 that contact the contact parts 1830, respectively, based on whether the contact part 1830 is pressed, a side key bracket 1850, in which the side key circuit board 1890 is seated, and molded members 1870 that are coupled to opposite ends of the side key bracket 1850 and are coupled to the outer housing 1810.

According to an embodiment, the molded member 1870 may be screw-coupled to the outer housing 1810 through a screw member 1880. For example, if the molded member 1870 is inserted into the coupling recess provided in the outer housing 1810, the screw hole formed in the molded member 1870 and the screw hole near the coupling recess formed in the outer housing 1810 are aligned with each other, and the screw member 1880 is inserted through the screw holes to screw-couple the molded member 1870 to the outer housing 1810.

Figure 19:
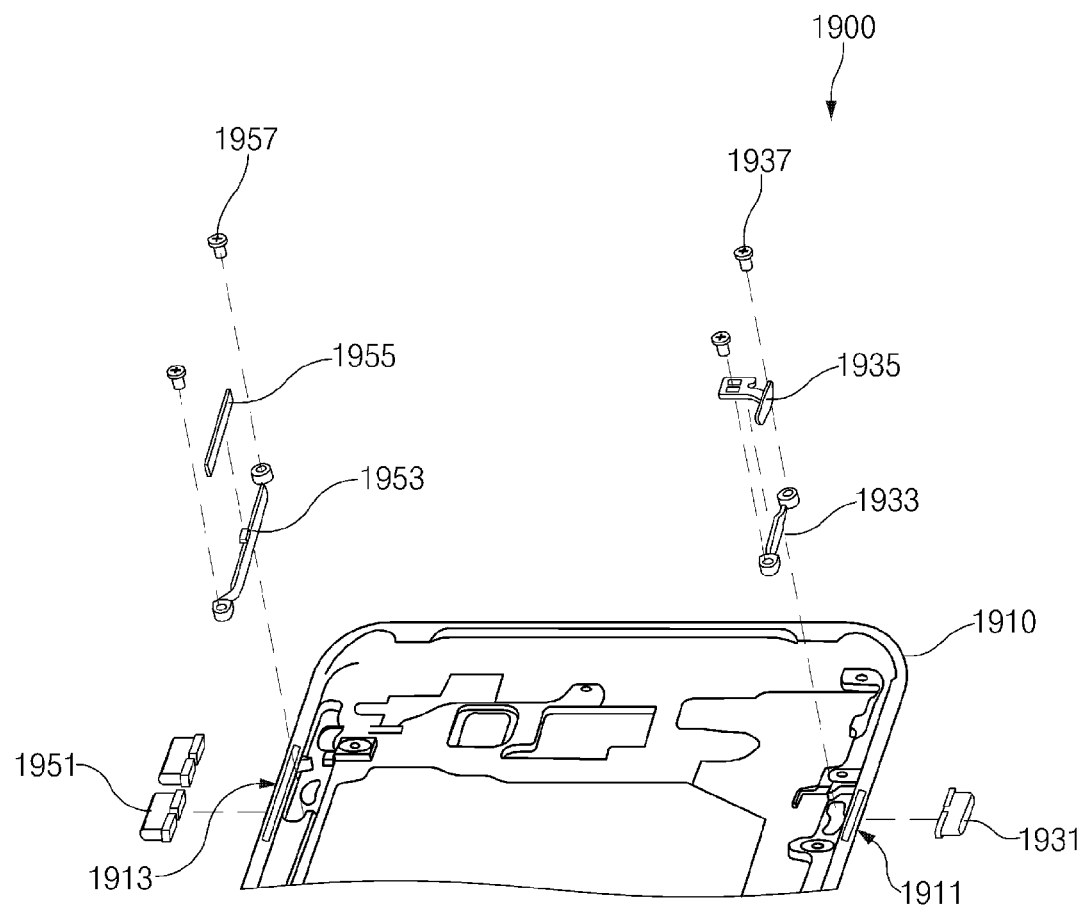
FIG. 19 illustrates an exploded assembly view of a side key of a third form and a side key of a fourth form that are coupled to an outer housing according to an embodiment of the present disclosure.

FIG. 19 illustrates an assembly view of a side key of a third form and a side key of a fourth form that are coupled to an outer housing according to an embodiment of the present disclosure.

Referring to FIG. 19, the electronic device 1900 may be configured such that side keys are coupled to peripheral areas of the outer housing 1910. In a process of coupling the side keys, a side key circuit board may be seated in a side key bracket, and the side key bracket having opposite ends, to which molded members are coupled, may be inserted into coupling recesses formed in the peripheral areas of the outer housing 1910 to be perpendicular to directions that face the front and rear sides of the outer housing 1910. The screw member is inserted through the screw hole formed in the molded member to screw-couple the molded member to the outer housing 1910. Further, the contact parts of the side keys may be inserted into and coupled to the through-holes formed on the side surfaces of the outer housing 1910.

As illustrated in FIG. 19, the side key (e.g., the side key having one contact part) of a third form is coupled to a right peripheral area of the outer housing 1910, and the side key (e.g., the side key having two contact parts) of a fourth form may be coupled to a left peripheral area of the outer housing 1910. For example, a first side key circuit board 1935 may be seated in a first side key bracket 1933, and the first side key bracket 1933 having opposite ends, to which the molded members are coupled, may be inserted into coupling recesses formed in the right peripheral area of the outer housing 1910 to be perpendicular to the directions that face the front and rear sides of the outer housing 1910, and a first screw member 1937 may be inserted through the screw hole formed in the molded member to screw-couple the molded member to the outer housing 1910. Further, the contact part 1931 of the side key of the third form may be inserted into and coupled to the first through-hole 1911 formed on the right side surface of the outer housing 1910.

Further, a second side key circuit board 1955 may be seated in a second side key bracket 1953, and the second side key bracket 1953 having opposite ends, to which the molded members are coupled, may be inserted into coupling recesses formed in the left peripheral area of the outer housing 1910 to be perpendicular to the directions that face the front and rear sides of the outer housing 1910, and a second screw member 1957 may be inserted through the screw hole formed in the molded member to screw-couple the molded member to the outer housing 1910. Further, the contact part 1951 of the side key of the fourth form may be inserted into and coupled to the second through-hole 1913 formed on the left side surface of the outer housing 1910.

Figure 20:
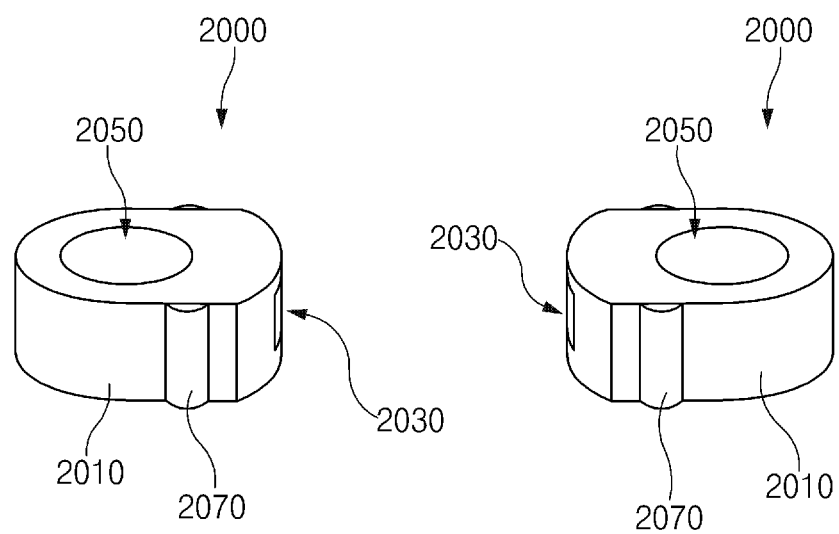
FIG. 20 illustrates a molded member of a second form, which includes a boss, according to an embodiment of the present disclosure.

FIG. 20 illustrates a molded member of a second form, which includes a boss, according to an embodiment of the present disclosure.

Referring to FIG. 20, the molded member 2000 may include a body 2010, and at least one boss 2070. The body 2010 may have a width that is the same as or similar to a coupling recess formed in an outer housing. An engaging recess 2030 may be provided on one side surface of the body 2010 such that a side key bracket (e.g., the side key bracket 1300 or the side key bracket 1400) may be engaged with the engaging recess 1130. The engaging recess 2030 may correspond to the length and width of a lengthwise side surface of the side key bracket. According to an embodiment, the molded member 2000 may be coupled to the side key bracket through insert molding.

The body 2010 may have a screw hole 2050 that passes through the front and rear surfaces of the body 2010 such that a screw member may be inserted into the screw hole 2050. According to an embodiment, a screw thread or a screw groove may be formed on an inner peripheral surface of the body 2010 having the screw hole 2050.

At least one boss 2070 may be provided on at least one side surface of the body 2010. The boss 2070 may protrude from one side surface of the body 2010 such that the molded member 2000 may be smoothly inserted into to the coupling recess provided in the outer housing. According to an embodiment, from the shape in which the molded member 2000 is coupled to the side key bracket, it is preferable that the boss 2070 is provided on a side surface of the body 2010, which faces a height direction of the side key bracket (e.g. towards the side surface of the outer housing). FIG. 20 illustrates a state in which one boss 2070 is provided on each of opposite side surfaces of the body 2010 that faces a height direction of the side key bracket.

Figure 21A:
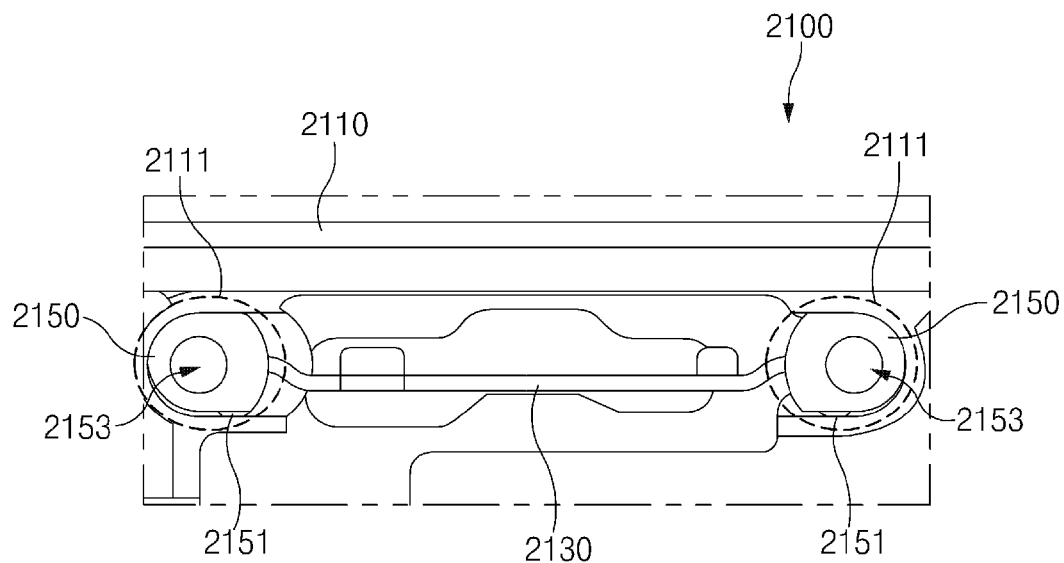
FIGS. 21A to 21C illustrate a state in which molded members of a second form, each of which includes a boss, are coupled to an outer housing of the present disclosure.
Figure 21B:
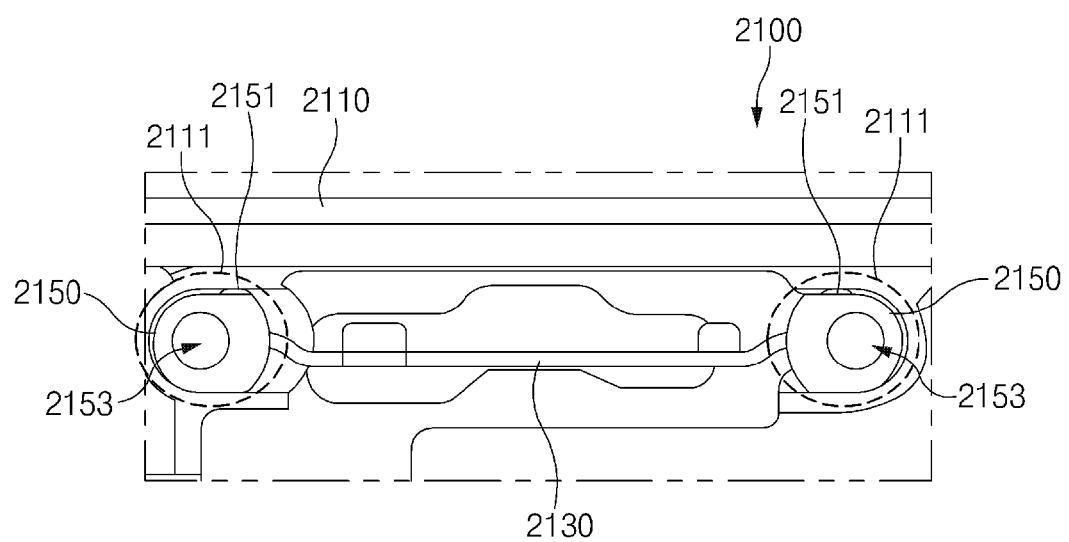
Figure 21C:
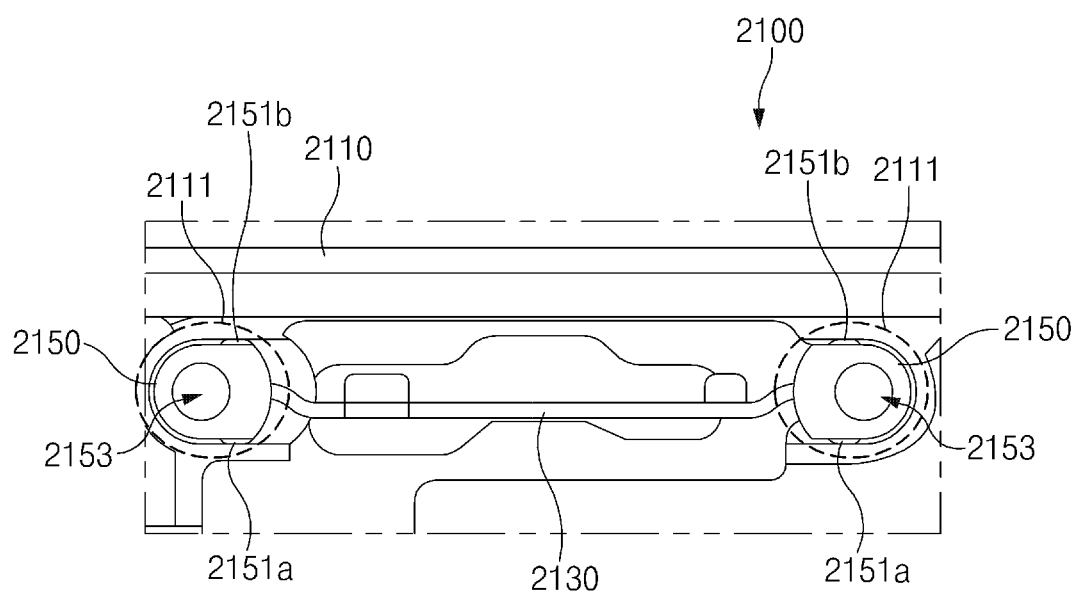

FIGS. 21A to 21C illustrate a state in which molded members of a second form, each of which includes a boss, are coupled to an outer housing.

Referring to FIGS. 21A to 21C, the electronic device 2100 may be configured such that side keys are coupled to peripheral areas of the outer housing 2110. According to an embodiment, the molded members 2150 coupled to the opposite ends of the side key bracket 2130 may be inserted into coupling recesses provided in specific areas 2111 of the outer housing 2110, and screw members are inserted through the screw holes 2153 formed in the molded members 2150 such that the molded members 2150 may be screw-coupled to the outer housing 2110.

According to an embodiment, at least one boss 2151 may be provided on at least one surface of each of the molded members 2150 so that the molded member 2150 may be smoothly inserted into the corresponding coupling recess provided in the corresponding specific area 2111 of the outer housing 2110. As illustrated in FIG. 21A, one boss 2151 may be provided on one side surface of the molded member 2150 that faces a lower height wise end of the side key bracket 2130. As illustrated in FIG. 21B, one boss 2151 may be provided on one side surface of the molded member 2150, which faces an upper height wise end of the side key bracket 2130. As illustrated in FIG. 21C, two bosses 2151*a* and 2151*b* may be provided on opposite side surfaces of the molded member 2150, which face the upper and lower height wise ends of the side key bracket 2130.

As described above, according to various embodiments, an electronic device may include an outer housing comprising a first surface facing in a first direction, a second surface facing in a second direction that is opposite to the first direction, and a side surface surrounding at least a portion of a space between the first surface and the second surface, a printed circuit board seated in the outer housing, and at least one side key coupled to the side surface of the outer housing. The side key may include at least one contact part exposed through a through-hole formed in the side surface of the outer housing, a side key circuit board comprising a switch module that contacts the contact part when the contact part is pressed, the side key circuit board being electrically connected to the printed circuit board, a side key bracket in which at least a portion of the side key circuit board is seated and which fixes and supports the side key circuit board, and one or more molded members that are coupled to opposite ends of the side key bracket and are coupled to the outer housing.

The side key bracket may include a central part, a first extending part that extends from the central part in a left lengthwise direction thereof to be inclined upward, a first peripheral part that extends from the first extending part in a left lengthwise direction thereof to be substantially parallel to the central part, a second extending part that extends from the central part in a right lengthwise direction thereof to be inclined upward, and a second peripheral part that extends from the second extending part in a right lengthwise direction thereof to be substantially parallel to the central part.

The one or more molded members may include a first molded member coupled to the first peripheral part and a second molded member coupled to the second peripheral part.

At least one hole may be formed in at least one of the first peripheral part or the second peripheral part.

At least one guide hole that guides a seating location of the side key circuit board may be formed in the central part such that the contact part and the switch module are aligned.

The side key bracket may include a central part, a first extending part that extends from the central part in a left lengthwise direction thereof to be inclined upward, a second extending part that extends from the first extending part in a left lengthwise direction thereof to be substantially parallel to the central part, a first peripheral part that extends from the second extending part, the first peripheral part formed in a cylindrical shape of which bottom surface faces in a widthwise direction thereof, a third extending part that extends from the central part in a right lengthwise direction thereof to be inclined upward, a fourth extending part that extends from the third extending part in a right lengthwise direction thereof to be substantially parallel to the central part, and a second peripheral part that extends from the fourth extending part, the second peripheral part formed in a cylindrical shape of which bottom surface faces in a widthwise direction thereof.

The one or more molded members may include a first molded member coupled to the first peripheral part and a second molded member coupled to the second peripheral part.

At least one hole may be formed in at least one of the first peripheral part or the second peripheral part.

The at least one hole may pass through two surfaces of the cylindrical shape.

Each of the molded members may include a screw-hole that passes through front and rear surfaces thereof. The at least one hole and the screw hole may face in the same direction.

At least one guide hole that guides a seating location of the side key circuit board may be formed in the central part such that the contact part and the switch module are aligned.

The side key bracket may include at least one protrusion that extends from one side surface thereof, is bent in a height direction thereof, and extends a specific length.

At least a portion of the side key bracket may be formed of stainless steel.

The one or more molded members may be coupled to the side key bracket through insert molding.

The one or more molded members may be formed of polycarbonate (PC).

Each of the molded members may include a body, and an engaging recess that is formed on one surface of the body, the side key bracket being engaged with the engaging recess.

Each of the molded members may further include a hook that extends from a lower end of an opposite side surface of the body and has a shape that protrudes by a specific length. The hook may be hook-coupled to a stopper formed on one side surface of a coupling recess provided in the outer housing.

Each of the molded members may further include a screw-hole that passes through front and rear surfaces of the body, and a screw member is inserted into the screw hole to be screw-coupled to the outer housing.

Each of the molded members may further include at least one boss that protrudes from at least one side surface of the body.

Figure 22:
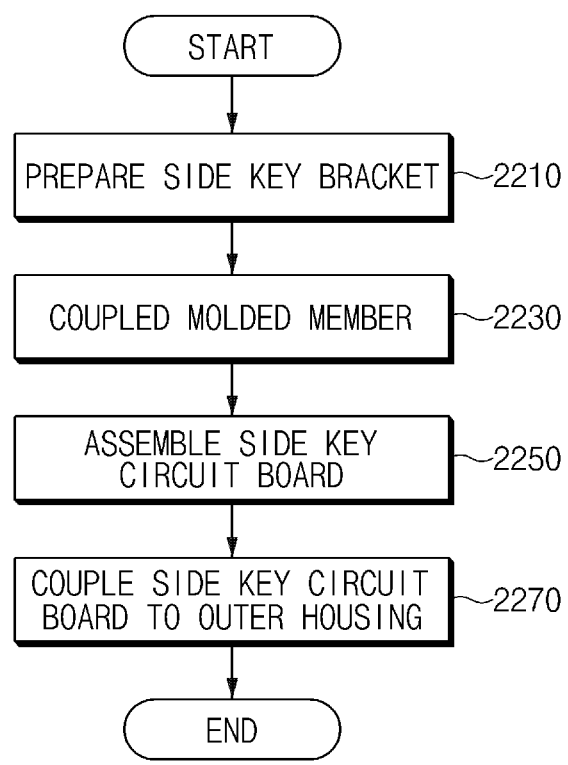
FIG. 22 illustrates a flow chart illustrating a process of assembling some components of a side key according to an embodiment of the present disclosure.

FIG. 22 illustrates a flow chart illustrating a process of assembling components of a side key according to an embodiment of the present disclosure.

Referring to FIG. 22, in step 2210, a side key bracket (e.g., the side key bracket 400 of the first form, the side key bracket 500 of the second form, the side key bracket 1300 of the third form, and the side key bracket 1400 of the fourth form) may be prepared. The side key bracket 1400 may correspond to the length and width of the side key circuit board, and may extend such that opposite peripheral areas of the side key bracket 1400 may be stepped in a height direction thereof (e.g., a widthwise direction of the outer housing). The side key bracket may have a cylindrical shape in which the peripheral parts on the opposite ends thereof faces a widthwise direction (e.g., the front and rear directions of the outer housing) of the side key bracket, and each of the peripheral parts may include at least one hole that passes through the upper and lower surfaces (e.g., two bottom surfaces of the cylindrical shape) of the side key bracket. The side key bracket may be formed of a material (e.g., stainless steel) having a specific strength.

In step 2230, molded members (e.g., the molded members 600 of the first form or the molded members 1100 of the second form) may be coupled to the opposite ends of the side key bracket. The molded members may have a width that is the same as or similar to the coupling recesses formed in the outer housing. An engaging recess may be provided on one side surface of the body of each of the molded members such that the side key bracket may be coupled to the engaging recess. The engaging recess may correspond to the length and width of a lengthwise side surface of the side key bracket. The molded member may include a hook that extends from a lower end of one side surface of the body and protrudes a specific length. Further, a screw hole that passes through the front and rear surfaces of the body may be provided in the body of the molded member such that a screw member may be inserted into the screw hole. At least one boss that protrudes in a boss shape may be provided at least one surface of the molded member.

The molded member may be coupled to the side key bracket through insert molding, and the molded members may be formed of plastic (e.g., polycarbonate (PC)).

In step 2250, a side key circuit board may be assembled in the side key bracket. The side key circuit board may be seated in a space that is defined by a step formed in a height direction of the side key bracket. The side key bracket includes at least one protrusion that extends from one side surface of the side key bracket, is bent in a height direction thereof, and extends a specific length, and the protrusion may prevent the side key circuit board from moving in a widthwise direction of the side key bracket and may prevent the side key circuit board from being separated from the side key bracket.

The side key bracket may include a guide hole that guides a seating location of the side key circuit board such that a switch module provided between the contact part of the side key and the side key circuit board may be aligned when the side key circuit board is seated.

In step 2270, the side key bracket in which the side key circuit board is seated and which has opposite ends, to which the molded members are coupled, may be coupled to the outer housing. The molded members may be coupled to the coupling recesses formed in the outer housing. The hook formed in the molded member may be hook-coupled to a stopper formed on one side surface of the coupling recess provided in the outer housing. Alternatively, the molded members may be screw-coupled to the outer housing by inserting the molded members into coupling recesses provided in the outer housing and inserting the screw members into the screw holes formed in the molded members. In this case, screw holes may be provided in the coupling recesses, into which the molded members are inserted, in the outer housing. For example, when the molded members are inserted into the coupling recesses provided in the outer housing, screw holes may be provided on the rear surface of the outer housing that faces the molded members. Accordingly, if the molded members are inserted into the coupling recesses provided in the outer housing, the screw holes provided in the molded members and the screw holes provided in the outer housing are aligned with each other, and the screw members are inserted through the aligned screw holes so that the molded members may be screw-coupled to the outer housing.

According to the embodiments of the present disclosure, an assembly deviation may be reduced by using the molded members corresponding to the widths of the coupling recesses when the side key bracket is coupled to an outer housing.

The term "module" used herein may represent, for example, a unit including one of hardware, software and firmware or a combination thereof. The term "module" may be interchangeably used with the terms "unit", "logic", "logical block", "component" and "circuit". The "module" may be a minimum unit of an integrated component or may be a part thereof. The "module" may be a minimum unit for performing one or more functions or a part thereof. The "module" may be implemented mechanically or electronically. For example, the "module" may include at least one of an application-specific integrated circuit (ASIC) chip, a field-programmable gate array (FPGA), and a programmable-logic device for performing some operations, which are known or will be developed.

At least a part of devices (e.g., modules or functions thereof) or methods (e.g., operations) according to various embodiments of the present disclosure may be implemented as instructions stored in a computer-readable storage medium in the form of a program module. In the case where the instructions are performed by a processor, the processor may perform functions corresponding to the instructions. The computer-readable storage medium may be, for example, a memory.

A computer-readable recording medium may include a hard disk, a floppy disk, a magnetic medium (e.g., a magnetic tape), an optical medium (e.g., CD-ROM, digital versatile disc (DVD)), a magneto-optical medium (e.g., a floptical disk), or a hardware device (e.g., a ROM, a RAM, a flash memory, or the like). The program instructions may include machine language codes generated by compilers and high-level language codes that can be executed by computers using interpreters. The above-mentioned hardware device may be configured to be operated as one or more software modules for performing operations of various embodiments of the present disclosure and vice versa.

A module or a program module according to various embodiments of the present disclosure may include at least one of the above-mentioned elements, or some elements may be omitted or other additional elements may be added. Operations performed by the module, the program module or other elements according to various embodiments of the present disclosure may be performed in a sequential, parallel, iterative or heuristic way. Furthermore, some operations may be performed in another order or may be omitted, or other operations may be added.

While the present disclosure has been shown and described with reference to certain embodiments thereof, it will be understood by those skilled in the art that various changes in form and details may be made therein without departing from the scope of the present disclosure. Therefore, the scope of the present disclosure should not be defined as being limited to the embodiments, but should be defined by the appended claims and equivalents thereof.

What is claimed is:

1. An electronic device comprising:
    an outer housing comprising a first surface facing in a first direction, a second surface facing in a second direction that is opposite to the first direction, and a side surface surrounding at least a portion of a space between the first surface and the second surface;
    a printed circuit board seated in the outer housing; and
    at least one side key coupled to the side surface of the outer housing,
    wherein the side key comprises:
        at least one contact part exposed through a through-hole formed in the side surface of the outer housing;
        a side key circuit board comprising a switch module that contacts the contact part when the contact part is pressed, the side key circuit board being electrically connected to the printed circuit board;
        a side key bracket in which at least a portion of the side key circuit board is seated and which fixes and supports the side key circuit board; and
        one or more molded members that are coupled to opposite ends of the side key bracket and are coupled to the outer housing,
    wherein the side key bracket further comprises:
        a central part;
        a first extending part that extends from the central part in a left lengthwise direction thereof to be inclined upward;
        a second extending part that extends from the first extending part in a left lengthwise direction thereof to be substantially parallel to the central part;
        a first peripheral part that extends from the second extending part, the first peripheral part formed in a cylindrical shape of which a bottom surface faces in a widthwise direction thereof;
        a third extending part that extends from the central part in a right lengthwise direction thereof to be inclined upward;
        a fourth extending part that extends from the third extending part in a right lengthwise direction thereof to be substantially parallel to the central part; and a second peripheral part that extends from the fourth extending part, the second peripheral part formed in a cylindrical shape of which a bottom surface faces in a widthwise direction thereof.

2. The electronic device of claim 1, wherein the one or more molded members comprise a first molded member coupled to the first peripheral part and a second molded member coupled to the second peripheral part.

3. The electronic device of claim 1, wherein at least one hole is formed in at least one of the first peripheral part or the second peripheral part.

4. The electronic device of claim 1, wherein at least one guide hole that guides a seating location of the side key circuit board is formed in the central part such that the contact part and the switch module are aligned.

5. The electronic device of claim 1, wherein the one or more molded members comprise a first molded member coupled to the first peripheral part and a second molded member coupled to the second peripheral part.

6. The electronic device of claim 1, wherein at least one hole is formed in at least one of the first peripheral part or the second peripheral part.

7. The electronic device of claim 6, wherein the at least one hole passes through two surfaces of the cylindrical shape.

8. The electronic device of claim 7, wherein each of the molded members comprises:
   a screw-hole that passes through front and rear surfaces thereof, and
   wherein the at least one hole and the screw hole face in the same direction.

9. The electronic device of claim 1, wherein at least one guide hole that guides a seating location of the side key circuit board is formed in the central part such that the contact part and the switch module are aligned.

10. The electronic device of claim 1, wherein the side key bracket comprises:
    at least one protrusion that extends from one side surface thereof, is bent in a height direction thereof, and extends a specific length.

11. The electronic device of claim 1, wherein at least a portion of the side key bracket is formed of stainless steel.

12. The electronic device of claim 1, wherein the one or more molded members are coupled to the side key bracket through insert molding.

13. The electronic device of claim 1, wherein the one or more molded members are formed of polycarbonate (PC).

14. The electronic device of claim 1, wherein each of the molded members comprises:
    a body; and
    an engaging recess that is formed on one surface of the body, the side key bracket being engaged with the engaging recess.

15. The electronic device of claim 14, wherein each of the molded members further comprises:
    a hook that extends from a lower end of an opposite side surface of the body and has a shape that protrudes a specific length, and
    wherein the hook is hook-coupled to a stopper formed on one side surface of the coupling recess.

16. The electronic device of claim 14, wherein each of the molded members further comprises:
    a screw-hole that passes through front and rear surfaces of the body, and
    a screw member that is inserted into the screw hole to be screw-coupled to the outer housing.

17. The electronic device of claim 14, wherein each of the molded members further comprises:
    at least one boss that protrudes from at least one side surface of the body.

* * * * *